(12) United States Patent
Ueda

(10) Patent No.: US 8,867,300 B2
(45) Date of Patent: Oct. 21, 2014

(54) SEMICONDUCTOR MEMORY DEVICE, MEMORY SYSTEM AND ACCESS METHOD TO SEMICONDUCTOR MEMORY DEVICE

(71) Applicant: Kabushiki Kaisha Toshiba, Tokyo (JP)

(72) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/089,321

(22) Filed: Nov. 25, 2013

(65) Prior Publication Data

US 2014/0085972 A1    Mar. 27, 2014

Related U.S. Application Data

(63) Continuation of application No. PCT/JP2012/056290, filed on Mar. 12, 2012.

(30) Foreign Application Priority Data

May 26, 2011 (JP) .................................. 2011-118310

(51) Int. Cl.
   *G11C 8/12* (2006.01)
   *G11C 13/00* (2006.01)
   *G11C 11/16* (2006.01)
(52) U.S. Cl.
   CPC ........ *G11C 11/1659* (2013.01); *G11C 13/0007* (2013.01); *G11C 13/0061* (2013.01); *G11C 13/0069* (2013.01); *G11C 13/004* (2013.01); *G11C 13/0023* (2013.01); *G11C 13/0004* (2013.01)
   USPC ....... 365/230.03; 365/148; 365/158; 365/163
(58) Field of Classification Search
   USPC ................ 365/230.03, 230.04, 148, 158, 163
   See application file for complete search history.

(56) References Cited

U.S. PATENT DOCUMENTS 5,367,495 A * 11/1994 Ishikawa ....................... 365/239
5,749,086 A    5/1998 Ryan (Continued)

FOREIGN PATENT DOCUMENTS

JP    H9(1997)-231132    9/1997
JP    2000-506301        5/2000

(Continued)

OTHER PUBLICATIONS

International Preliminary Report on Patentability for International Application No. PCT/JP2012/056290, mailed Dec. 5, 2013, in 6 pages.

(Continued)

*Primary Examiner* — Hoai V Ho
*Assistant Examiner* — Jay Radke
(74) *Attorney, Agent, or Firm* — Knobbe, Martens, Olson & Bear LLP

(57) ABSTRACT

A semiconductor memory device includes a block array having an m number of memory blocks in a row direction and an n number of memory blocks in a column direction (m being an integer of 2 or more and n being an integer of 1 or more), a page selection circuit configured to select a row in the block array as a page to be selected, and a page buffer configured to store data to be written in a page selected by the page selection circuit or data read from the page. Each of the memory blocks includes a memory cell array having a plurality of memory cells, a row selection circuit configured to select a row of the memory cell array, and a column selection circuit configured to select a column of the memory cell array.

20 Claims, 26 Drawing Sheets

(56) References Cited

U.S. PATENT DOCUMENTS

| | | |
|---|---|---|
| 7,327,617 B2 | 2/2008 | Lim |
| 7,755,077 B2 | 7/2010 | Inaba |
| 8,097,875 B2 | 1/2012 | Inaba |
| 8,111,540 B2 | 2/2012 | Asao et al. |
| 8,149,609 B2 | 4/2012 | Nagashima |
| 8,199,597 B2 | 6/2012 | Ueda |
| 8,508,977 B2 | 8/2013 | Ueda |
| 2005/0237820 A1 | 10/2005 | Takemura et al. |
| 2006/0181940 A1 | 8/2006 | Lim |
| 2008/0278997 A1 | 11/2008 | Katagiri |
| 2009/0014703 A1 | 1/2009 | Inaba |
| 2009/0052233 A1 | 2/2009 | Nakai |
| 2010/0085804 A1 | 4/2010 | Katagiri et al. |
| 2010/0237321 A1 | 9/2010 | Inaba |
| 2010/0238708 A1 | 9/2010 | Nagashima |
| 2010/0277972 A1 | 11/2010 | Ueda |
| 2011/0235402 A1 | 9/2011 | Ueda |
| 2012/0155147 A1 | 6/2012 | Nagashima |
| 2013/0322163 A1 | 12/2013 | Ueda |

FOREIGN PATENT DOCUMENTS

| | | |
|---|---|---|
| JP | 2005-158199 | 6/2005 |
| JP | 2006-221651 | 8/2006 |
| JP | 2008-192990 | 8/2008 |
| JP | 2008-282434 | 11/2008 |
| JP | 2009-054213 | 3/2009 |
| JP | 2010-27202 | 2/2010 |
| JP | 2010-86634 | 4/2010 |
| JP | 2010-103302 | 5/2010 |
| JP | 2010-225227 | 10/2010 |
| JP | 2010-262695 | 11/2010 |
| JP | 2011-198438 | 10/2011 |

OTHER PUBLICATIONS

Jedec Standard, Low Power Double Data Rate 2, JESD209-2D, dated Dec. 2010, Jedec Solid State Technology Association, in 284 pages.
International Search Report for International Application No. PCT/JP2012/056290, mailed May 29, 2012, in 2 pages.

* cited by examiner

| Items | | 1Gb | 2Gb | 4Gb | 8Gb | 16Gb | 32Gb |
|---|---|---|---|---|---|---|---|
| Prefetch | | 4n | 4n | 4n | 4n | 4n | 4n |
| Number of Banks | | 8 | 8 | 8 | 8 | 8 | 8 |
| Bank Address | | BA0-NA2 | BA0-NA2 | BA0-NA2 | BA0-NA2 | BA0-NA2 | BA0-NA2 |
| X8 | Row Address | R0-R9 | R0-R10 | R0-R10 | R0-R10 | R0-R11 | R0-R11 |
| | Column Address | C0-C6 | C0-C6 | C0-C7 | C0-C7 | C0-C7 | C0-C8 |
| | Page Address | P0-P6 | P0-P6 | P0-P6 | P0-P7 | P0-P7 | P0-P7 |
| | Page Buffer Size | 128B | 128B | 128B | 256B | 256B | 256B |
| X16 | Row Address | R0-R9 | R0-R10 | R0-R10 | R0-R10 | R0-R11 | R0-R11 |
| | Column Address | C0-C6 | C0-C6 | C0-C7 | C0-C7 | C0-C7 | C0-C8 |
| | Page Address | P0-P5 | P0-P5 | P0-P5 | P0-P6 | P0-P6 | P0-P6 |
| | Page Buffer Size | 128B | 128B | 128B | 256B | 256B | 256B |
| X32 | Row Address | R0-R9 | R0-R10 | R0-R10 | R0-R10 | R0-R11 | R0-R11 |
| | Column Address | C0-C6 | C0-C6 | C0-C7 | C0-C7 | C0-C7 | C0-C8 |
| | Page Address | P0-P4 | P0-P4 | P0-P4 | P0-P5 | P0-P5 | P0-P5 |
| | Page Buffer Size | 128B | 128B | 128B | 256B | 256B | 256B | page buffer size [Byte] = $2^{\text{(page address bits)}} * \text{(DQ bits)} / 8$

FIG. 7

| Command | SDR Command Pins | | | DDR CA Pins (10) | | | | | | | | | | | |
|---|---|---|---|---|---|---|---|---|---|---|---|---|---|---|---|
| | CKE | | CS_N | CA0 | CA1 | CA2 | CA3 | CA4 | CA5 | CA6 | CA7 | CA8 | CA9 | CK_t EDGE |
| | CK_t(n-1) | CK_t(n) | | | | | | | | | | | | |
| RAS (per bank) | H | H | L | L | H | L | L | RFU | R10 | R11 | BA0 | BA1 | BA2 | ↑ |
| | | | X | R0 | R1 | R2 | R3 | R4 | R5 | R6 | R7 | R8 | R9 | → |
| RAS (all bank) | H | H | L | L | H | L | H | RFU | R10 | R11 | X | X | X | ↑ |
| | | | X | R0 | R1 | R2 | R3 | R4 | R5 | R6 | R7 | R8 | R9 | → |
| CAS (per bank) | H | H | L | L | H | H | L | RFU | C10 | C11 | BA0 | BA1 | BA2 | ↑ |
| | | | X | C0 | C1 | C2 | C3 | C4 | C5 | C6 | C7 | C8 | C9 | → |
| CAS (all bank) | H | H | L | L | H | H | H | RFU | C10 | C11 | X | X | X | ↑ |
| | | | X | C0 | C1 | C2 | C3 | C4 | C5 | C6 | C7 | C8 | C9 | → |
| WRITE | H | H | L | H | L | L | RFU | RFU | P10 | P11 | BA0 | BA1 | BA2 | ↑ |
| | | | X | P0 | P1 | P2 | P3 | P4 | P5 | P6 | P7 | P8 | P9 | → |
| READ | H | H | L | H | L | H | RFU | RFU | P10 | P11 | BA0 | BA1 | BA2 | ↑ |
| | | | X | P0 | P1 | P2 | P3 | P4 | P5 | P6 | P7 | P8 | P9 | → |

BA0-BA2: BANK ADDRESS
R0-R11: ROW ADDRESS
C0-C11: COLUMN ADDRESS
P0-P11: PAGE ADDRESS
RFU: RESERVATION FOR FUTURE USE

FIG. 9

Random Cycle Burst READ: RL=3, BL=4

CAS Cycle Burst READ: RL=3, BL=4

RAS Cycle Burst READ: RL=3, BL=4

Burst READ to Burst READ: RL=3, BL=4

Random Cycle Burst WRITE: WL=1, BL=4

Burst WRITE to Burst WRITE: WL=1, BL=4

Burst WRITE to Burst READ: RL=3, WL=1, BL=4

Extended Seamless Burst READ: RL=3, BL=4

CAS Interleave Burst READ: RL=3, BL=4

Extended Seamless Burst WRITE: WL=1, BL=4

US 8,867,300 B2

SEMICONDUCTOR MEMORY DEVICE, MEMORY SYSTEM AND ACCESS METHOD TO SEMICONDUCTOR MEMORY DEVICE

CROSS REFERENCE TO RELATED APPLICATIONS

This application is based upon and claims the benefit of priority from the prior Japanese Patent Application No. 2011-118310 filed on May 26, 2011 and PCT application No. PCT/W2012/056290 filed on Mar. 12, 2012, the entire contents of which are incorporated herein by reference.

TECHNICAL FIELD

Embodiments of the present invention relate to a semiconductor memory device provided with non-volatile and non-destructively readable memory cells, a memory system, and an access method to a semiconductor memory device.

BACKGROUND ART

An MRAM (Magnetoresistive Random Access Memory) has been developed as a low-power consuming and high-speed accessible non-volatile memory. However, in an MRAM, setting (writing) and detection (reading) of a magnetization direction of an MTJ (Magnetic Tunnel Junction) element are performed with a current. Therefore, if reading and writing are simultaneously performed to a plurality of MTJ elements, circuit noises may be increased, thereby causing simultaneous access to a plurality of MTJ elements to be difficult.

LPDDR2 specification defined by JEDEC is known as standard specification for low-power consuming memories. This specification aims for optimization in accordance with non-volatility and non-destructive reading that are features of DRAMs. Therefore, the state transition by various commands is complex and hence it is not suitable to apply non-volatile memories such as MRAMs with the specification as it is.

DISCLOSURE OF INVENTION

A semiconductor memory device according to an embodiment comprises:
  a block array having an m number of memory blocks in a row direction and an n number of memory blocks in a column direction (m being an integer of 2 or more and n being an integer of 1 or more);
  a page selection circuit configured to select a row in the block array as a page to be selected; and
  a page buffer configured to store data to be written in a page selected by the page selection circuit or data read from the page,
  wherein each of the memory blocks comprises:
    a memory cell array having a plurality of memory cells;
    a row selection circuit configured to select a row of the memory cell array; and
    a column selection circuit configured to select a column of the memory cell array,
  wherein when a row-specifying command and a row address are given, a group of memory cells of a specific row corresponding to the given row address is selected for each of the n number of memory blocks aligned in the column direction in the block array,
  when a column-specifying command and a column address are given, a group of memory cells of a specific column corresponding to the given column address is selected for each of the m number of memory blocks aligned in the row direction in the block array, and
  when the page selection circuit is given a per-page read or write command and the corresponding page address, the page selection circuit simultaneously selects a plurality of memory cells separated from one another in a page indicated by the given page address among a group of memory cells selected by a row-specifying command, a row address, a column-specifying command and a column address that are given just before the per-page read or write command and the corresponding page address.

BRIEF DESCRIPTION OF DRAWINGS

FIG. 7 is a view showing an example of address allocation in the semiconductor memory device 1 of FIG. 6;

FIG. 9 is a view showing an example of a logical value of each signal in inputting each command in a semiconductor memory device 1 according to an embodiment;

BEST STATE FOR CARRYING OUT THE INVENTION

Hereinafter, embodiments will be explained with reference to the drawings.

Figure 1:
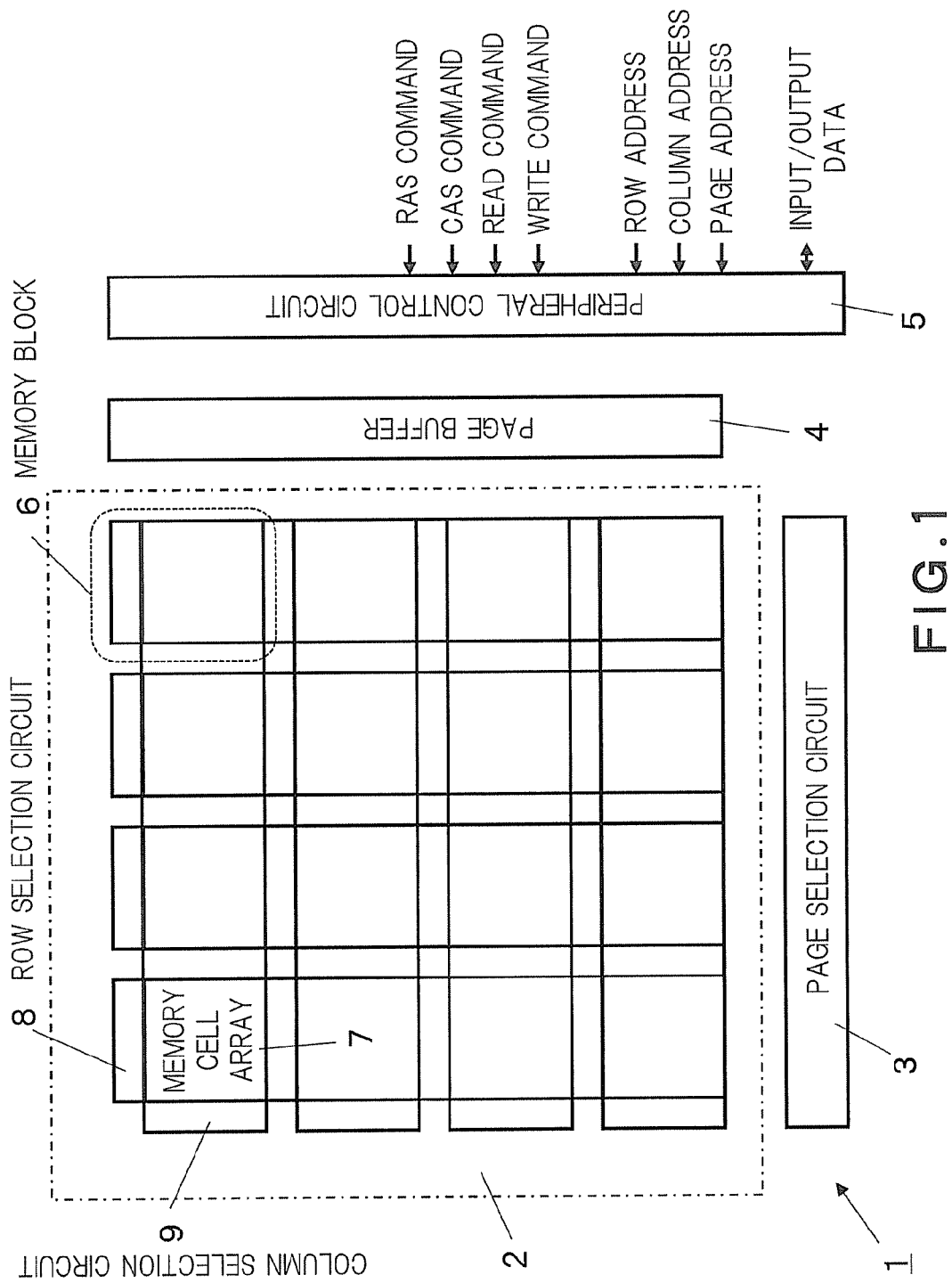
FIG. 1 is a block diagram schematically showing the configuration of a semiconductor memory device 1 according to an embodiment.

FIG. 1 is a block diagram schematically showing the configuration of a semiconductor memory device 1 according to an embodiment. The semiconductor memory device 1 of FIG. 1 is provided with a block array 2, a page selection circuit 3, a page buffer 4, and a peripheral control circuit 5.

The block array 2 has an m number of memory blocks 6 in a row direction and an n number of memory blocks 6 in a column direction (m being an integer of 2 or more and n being an integer of 1 nor more). Each memory block 6 has a memory cell array 7 of a plurality of memory cells, a row selection circuit 8 for selecting a row of the memory cell array 7, and a column selection circuit 9 for selecting a column of the memory cell array 7.

The page selection circuit 3 selects a specific page of the block array 2. Here, a page indicates a specific row selected from among all rows (all rows of the m number of memory cell arrays 7) in the block array 2. The selected specific row includes a group of memory cells for one row having the n number of memory cell array 7 in the column direction.

The page buffer 4 stores data read from a group of memory cells of the specific row described above or data to be written in the group of memory cells of the specific row.

The peripheral control circuit 5 performs control to send various commands, addresses, and data supplied from a processor or a controller (both not shown) to the block array 2 and to send data read from a memory cell to the processor or controller.

Commands to be supplied from the processor or controller to the peripheral control circuit 5 include, for example, a RAS command, a CAS command, a READ command, and a WRITE command.

The RAS command is a row-specifying command for selecting a specific row for each of a plurality of memory cell arrays 7 aligned in the row direction in the block array 2. A row address issued corresponding to a RAS command is simultaneously input to row selection circuits 8 of the memory blocks 6. Each row selection circuit 8 selects a memory cell on the row address in the corresponding memory cell array 7.

Figure 2:
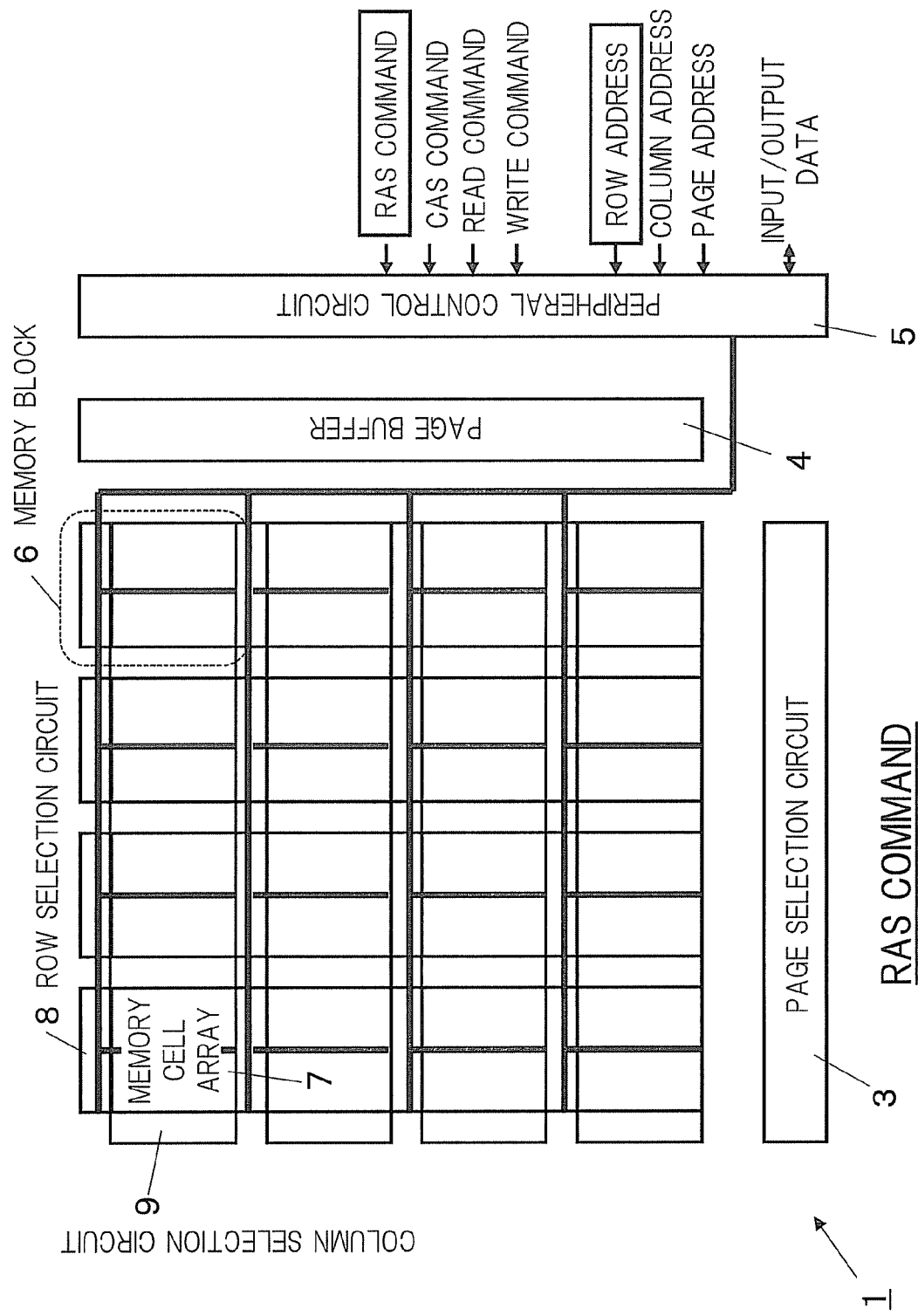
FIG. 2 is a view explaining an operation of a row selection circuit 8 in the case where a row address corresponding to a RAS command is issued.

FIG. 2 is a view explaining an operation of the row selection circuit 8 in the case where a row address corresponding to a RAS command is issued. A thick solid-line path in FIG. 2 indicates portions selected by a RAS command and a row address. As shown in FIG. 2, when a RAS command and a row address are issued, a plurality of memory cells on a specific row corresponding to the row address are selected for each of the n number of memory cell arrays 7 aligned in the column direction.

The CAS command is a column-specifying command for selecting a specific column for each of a plurality of memory cell arrays 7 aligned in the column direction in the block array 2. A column address issued corresponding to a CAS command is simultaneously input to column selection circuits 9 of the memory blocks 6. Each column selection circuits 9 selects a memory cell on the column address in the corresponding memory cell array 7.

Figure 3:
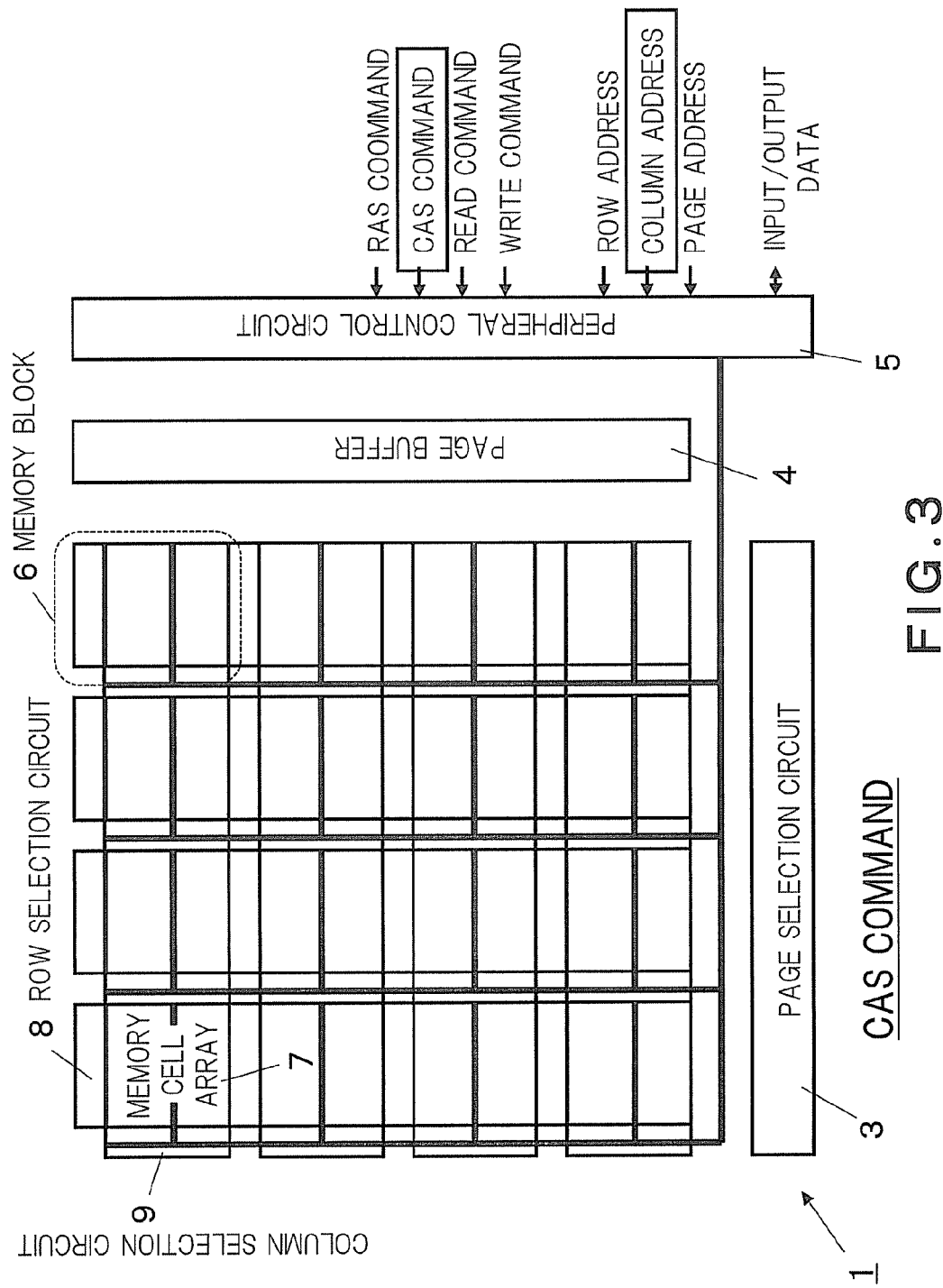
FIG. 3 is a view explaining an operation of a column selection circuit 9 in the case where a column address corresponding to a CAS command is issued.

FIG. 3 is a view explaining an operation of the column selection circuit 9 in the case where a column address corresponding to a CAS command is issued. A thick solid-line path in FIG. 3 indicates portions selected by a CAS command and a column address. As shown in FIG. 3, when a CAS command and a column address are issued, a plurality of memory cells on a specific column corresponding to the column address are selected for each of the m number of memory cell arrays aligned in the row direction.

The READ command is a read command for reading data from a plurality of memory cells that correspond to a page address in the block array 2. A page address issued corresponding to a READ command is input to the page selection circuit 3. The page selection circuit 3 selects data at the page address in the block array 2. The selected data is stored in the page buffer 4. The page address is an address for selecting data in the n number of memory cell arrays 7 located on a specific row in the block array 2 for each page described above. Since RAS and CAS commands are issued before a READ command is issued, data of a plurality of memory cells selected by the row selection circuit 8, the column selection circuit 9, and the page selection circuit 3 are stored in the page buffer 4.

Figure 4:
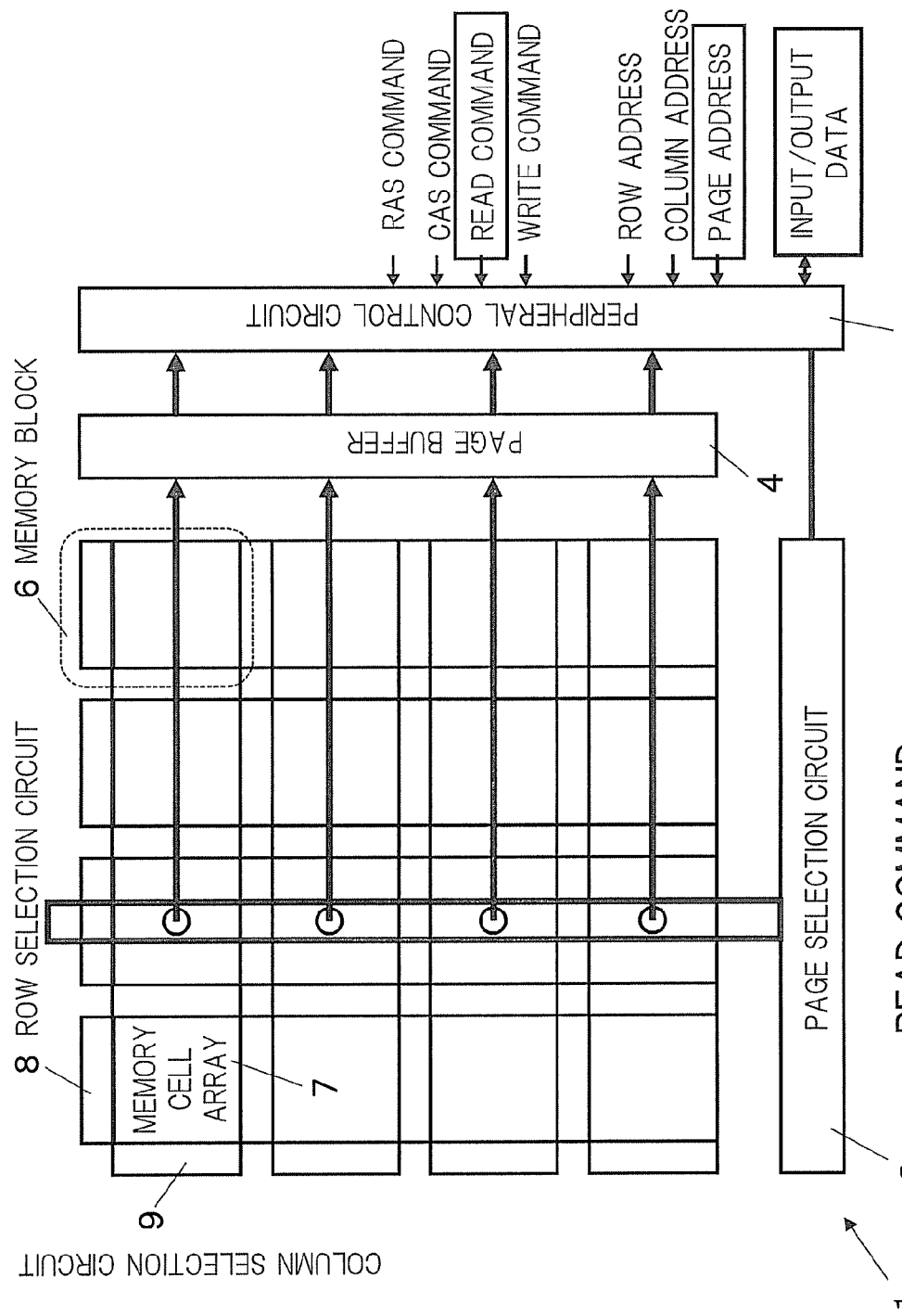
FIG. 4 is a view explaining an operation of a page selection circuit 3 in the case where a page address corresponding to a READ command is issued.

FIG. 4 is a view explaining an operation of the page selection circuit 3 in the case where a page address corresponding to a READ command is issued. A thick line frame in FIG. 4 indicates a page selected with a page address. Since RAS and CAS commands are issued before a READ command is issued, data of a plurality of memory cells surrounded by circles are read and stored in the page buffer 4. As described above, memory cells to be simultaneously read are distributed to a plurality of memory cell arrays.

The WRITE command is a write command for writing data in a plurality of memory cells corresponding to a page address in the block array 2. A page address issued corresponding to a WRITE command is input to the page selection circuit 3. The page selection circuit 3 selects data of a page address in the block array 2. The selected data is stored in the page buffer 4. The page address is an address for selecting data of the n number of memory cell arrays 7 located on a specific row in the block array 2 for each page described above. Since RAS and CAS commands are issued before a WRITE command is issued, data of the page buffer 4 are written in a plurality of memory cells selected by the row selection circuit 8, the column selection circuit 9, and the page selection circuit 3.

Figure 5:
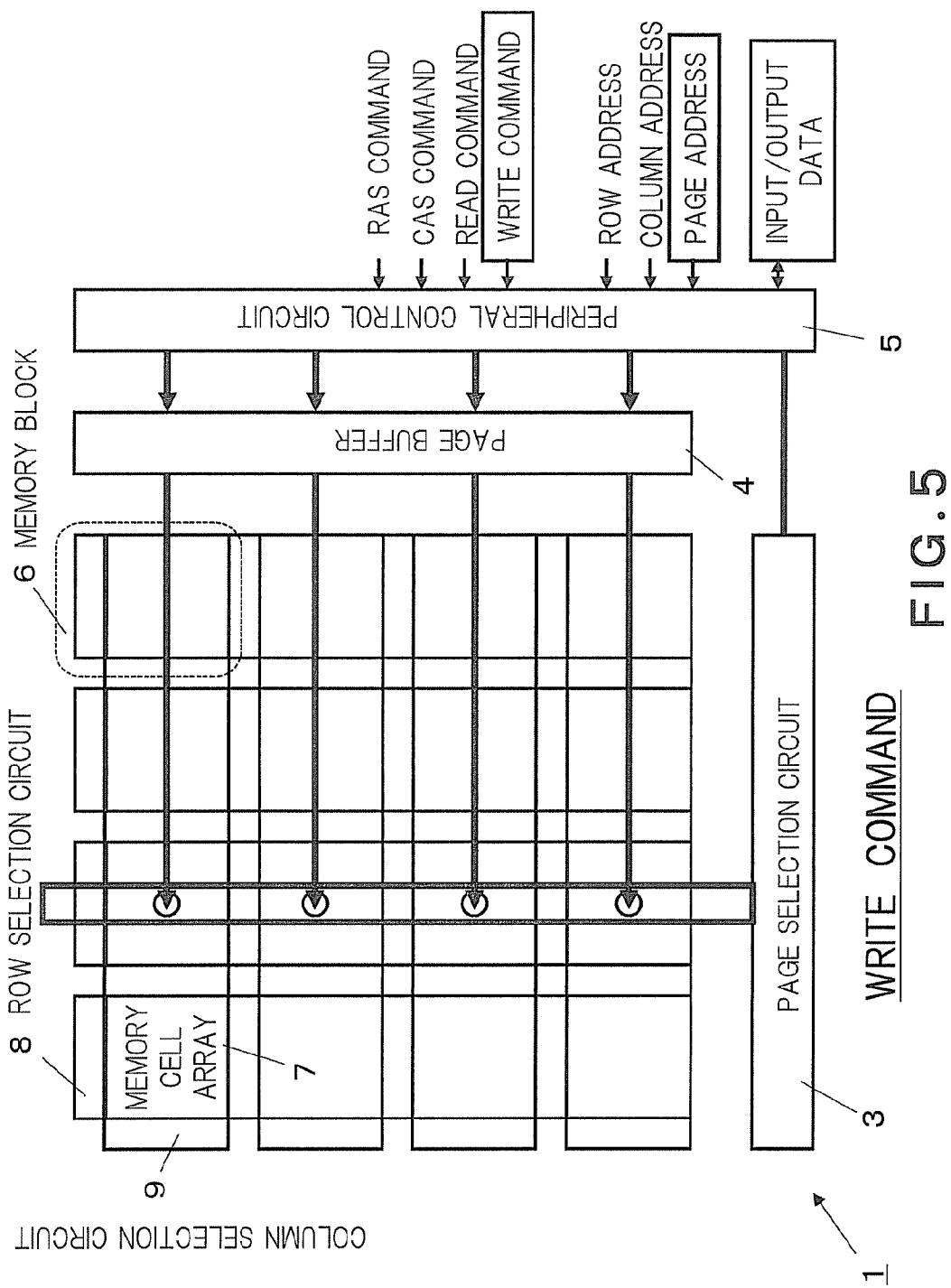
FIG. 5 is a view explaining an operation of the page selection circuit 3 in the case where a page address corresponding to a WRITE command is issued.

FIG. 5 is a view explaining an operation of the page selection circuit 3 in the case where a page address corresponding to a WRITE command is issued. A thick line frame in the block array 2 of FIG. 5 is selected with a page address. Since RAS and CAS commands are issued before a WRITE command is issued, data of the page buffer 4 are written in a plurality of memory cells surrounded by circles. As described above, memory cells to be simultaneously written are distributed to a plurality of memory cell arrays.

The semiconductor memory device 1 of this embodiment may have a bank memory configuration or not. In the case of a bank memory configuration, a region including the block array 2, the page selection circuit 3, and the page buffer 4 in FIG. 1 is put into a bank, so that a plurality of banks are provided. A semiconductor memory device 1 with a bank memory configuration will be described later.

As described above, in the first embodiment, to the entire block array 2, row selection and column selection are performed with a RAS command and a CAS command, respectively, and thereafter, reading and writing are performed per page with a READ command and a WRITE command. Accordingly, reading and writing can be performed to a plurality of memory cells at different locations and timings. Thus, even simultaneous reading from or writing to a plurality of memory cells withstands circuit noises. Therefore, even for memory cells, like MRAM cells, that require current flow in reading or writing, simultaneous reading from or writing to a plurality of memory cells becomes possible without increasing circuit noises.

Moreover, as described later, this embodiment has a feature in that, a RAS command, a CAS command, a READ command, and a WRITE command can be issued in any order. Therefore, memory-cell reading and writing control becomes easy, the internal configuration of the row selection circuit 8, the column selection circuit 9, and the page selection circuit 3 becomes simple, and reading and writing can be done at high speed.

Second Embodiment

A semiconductor memory device 1 according to a second embodiment has a feature of having a plurality of banks.

Figure 6:
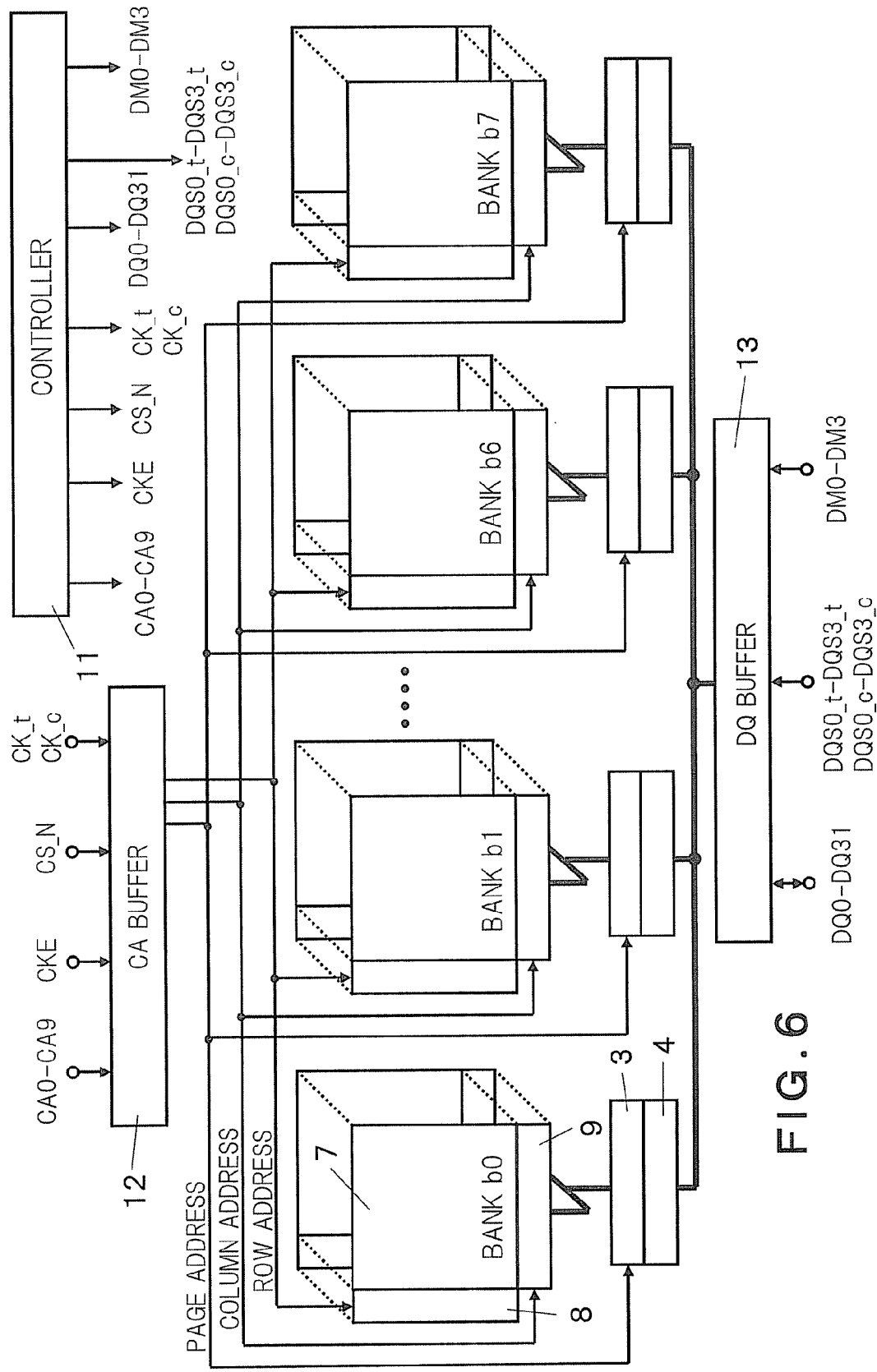
FIG. 6 is a block diagram schematically showing the configuration of an embodiment of a memory system provided with a semiconductor memory device 1 having a bank memory configuration.

FIG. 6 is a block diagram schematically showing the configuration of an embodiment of a memory system provided with a semiconductor memory device 1 having a plurality of banks. The memory system of FIG. 6 is provided with a semiconductor memory device 1 having eight banks b0 to b7 and a controller 11 that controls the semiconductor memory device 1.

The semiconductor memory device 1 of FIG. 6 has eight banks b0 to b7, a CA buffer 12, and a DQ buffer 13. Each bank is configured in the same manner as FIG. 1 to have a block array 2, a page selection circuit 3, and a page buffer 4. The block array 2 has the same internal configuration as FIG. 1.

To the CA buffer 12, command address signals CA0 to CA9 for identifying a command type, a clock enable signal CKE, a chip select signal CS_N, and clock signals CK_t and CK_c are input from the controller 11.

To the DQ buffer 13, data input/output signals DQ0 to DQ31, data strobe signals DQS0_t to DQS3_t and DQS0_c to DQS3_c, and data masking signals DM0 to DM3 are input.

The semiconductor memory device 1 of FIG. 6 issues various commands described above to a selected bank to perform similar operations to FIGS. 2 to 5.

FIG. 7 is a view showing an example of address allocation in the semiconductor memory device 1 of FIG. 6.

FIG. 7 includes, as Items, a prefetch type Prefetch, the total bank number Number of Banks, a Bank Address, and the number of I/O x8, x16 and x32. Each of x8, x16 and x32 includes a Row Address, a Column Address, a Page Address, and a Page Buffer Size.

In FIG. 7, information of each item described above is written for each of semiconductor memory devices 1 having a memory capacity of 1 Gbits, 2 Gbits, 4 Gbits, 8 Gbits, 16 Gbits, and 32 Gbits.

Each item and value in FIG. 7 are just an example. The memory capacity and the value of each item can take any information other than those shown therein.

Figure 8:
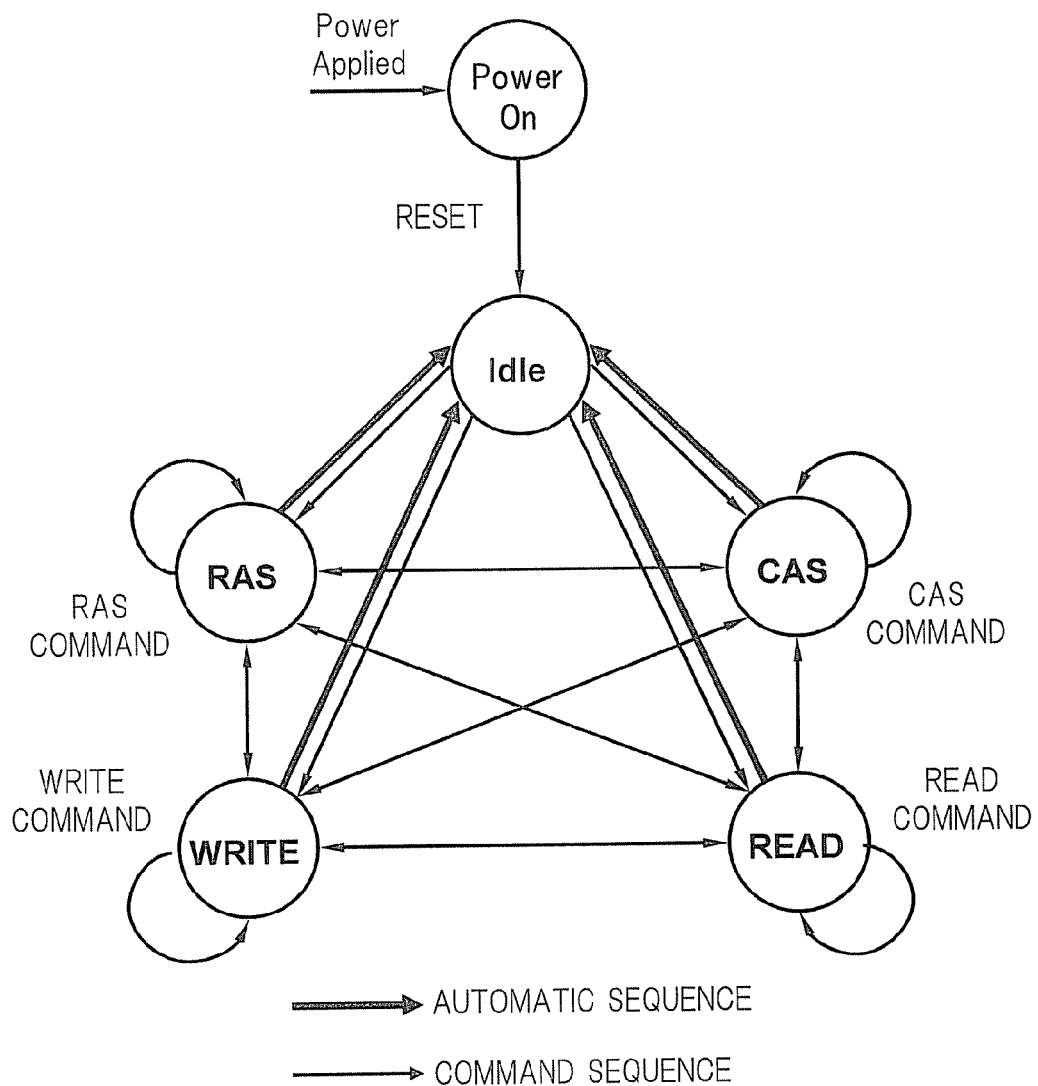
FIG. 8 is a state transition view of semiconductor memory devices 1 according to embodiments shown in FIGS. 1 and 6, respectively.

FIG. 8 is a state transition view of the semiconductor memory devices 1 according to the first and second embodiments shown in FIGS. 1 and 6. When a power supply voltage is supplied, the semiconductor memory device 1 changes into a power-on state. When a reset signal is input during the power-on state, a specific rest process is performed, so that the semiconductor memory device 1 changes into an Idle state.

When a RAS command is input during the Idle state, the semiconductor memory device 1 changes into a RAS state. In the RAS state, the semiconductor memory device 1 performs a row selection operation such as shown in FIG. 2. When a CAS command is input during the Idle state, the semiconductor memory device 1 changes into a CAS state. In the CAS state, the semiconductor memory device 1 performs a column selection operation such as shown in FIG. 3.

When a CAS command is input during the RAS state, the semiconductor memory device 1 changes into the CAS state. When a RAS command is input during the CAS state, the semiconductor memory device 1 changes into the RAS state.

When a READ command is input during the RAS or CAS state, the semiconductor memory device 1 changes into a READ state. In the READ state, as shown in FIG. 4, data read from a plurality of memory cells per page are stored in the page buffer 4. When a WRITE command is input during the RAS or CAS state, the semiconductor memory device 1 changes into a WRITE state. In the WRITE state, as shown in FIG. 5, data in the page buffer 4 are written in a plurality of memory cells in a selected page.

When a WRITE command is input during the READ state, the semiconductor memory device 1 changes into the WRITE state. When a READ command is input during the WRITE state, the semiconductor memory device 1 changes into the READ state.

When a specific time elapses after the semiconductor memory device 1 has changed into the RAS, CAS, READ, or WRITE state, the semiconductor memory device 1 automatically changes into the Idle state.

As understood from the state transition view of FIG. 8, in this embodiment, the semiconductor memory device 1 can change from any command state into another command state in any order, so that state transition by each command is very simple. Simple state transition means that the row selection circuit 8, the column selection circuit 9, and the page selection circuit 3 in the semiconductor memory devices 1 can have a simple internal configuration and hence high-speed access to the memory cells is possible. By contrast, in DRAMs, since a precharge operation is required and due to other factors, state transition becomes very complex and the internal configuration of circuits such as the row selection circuit 8 becomes complex, which restricts high-speed access.

FIG. 9 is a view showing an example of a logical value of each signal in inputting each command in the semiconductor memory device 1 according to this embodiment. In FIG. 9, there are two types for each of RAS and CAS commands. One type is to apply a RAS or CAS command to a specific bank. The other type is to apply a RAS or CAS command to all banks.

In applying a RAS or CAS command to a specific bank, at the rising timing of a clock signal CK_t, command address signals CA7 to CA9 specify specific bank addresses BA0 to BA2, and command address signals CA5 and CA6 specify bits R10 and R11 at the high-order bit side of a row address or bits C10 and C11 at the high-order bit side of a column address. Moreover, at the falling timing of the clock signal CK_t, command address signals CA5 and CA6 specify bits R0 to R9 at the low-order bit side of the row address or bits C0 to C9 at the low-order bit side of the column address.

READ and WRITE commands are not applied to all banks but only to a specific bank. At the rising timing of the clock signal CK_t, command address signals CA7 to CA9 specify specific bank addresses BA0 to BA2 and command address signals CA5 and CA6 specify bits P10 and P11 at the high-order bit side of a page address. Moreover, at the falling timing of the clock signal CK_t, command address signals CA5 and CA6 specify bits P0 to P9 at the low-order bit side of the page address.

FIGS. 10 to 25 are timing charts of the semiconductor memory device 1 according to this embodiment. FIGS. 10 to 14 show examples of a reading operation to the same bank.

Figure 10:
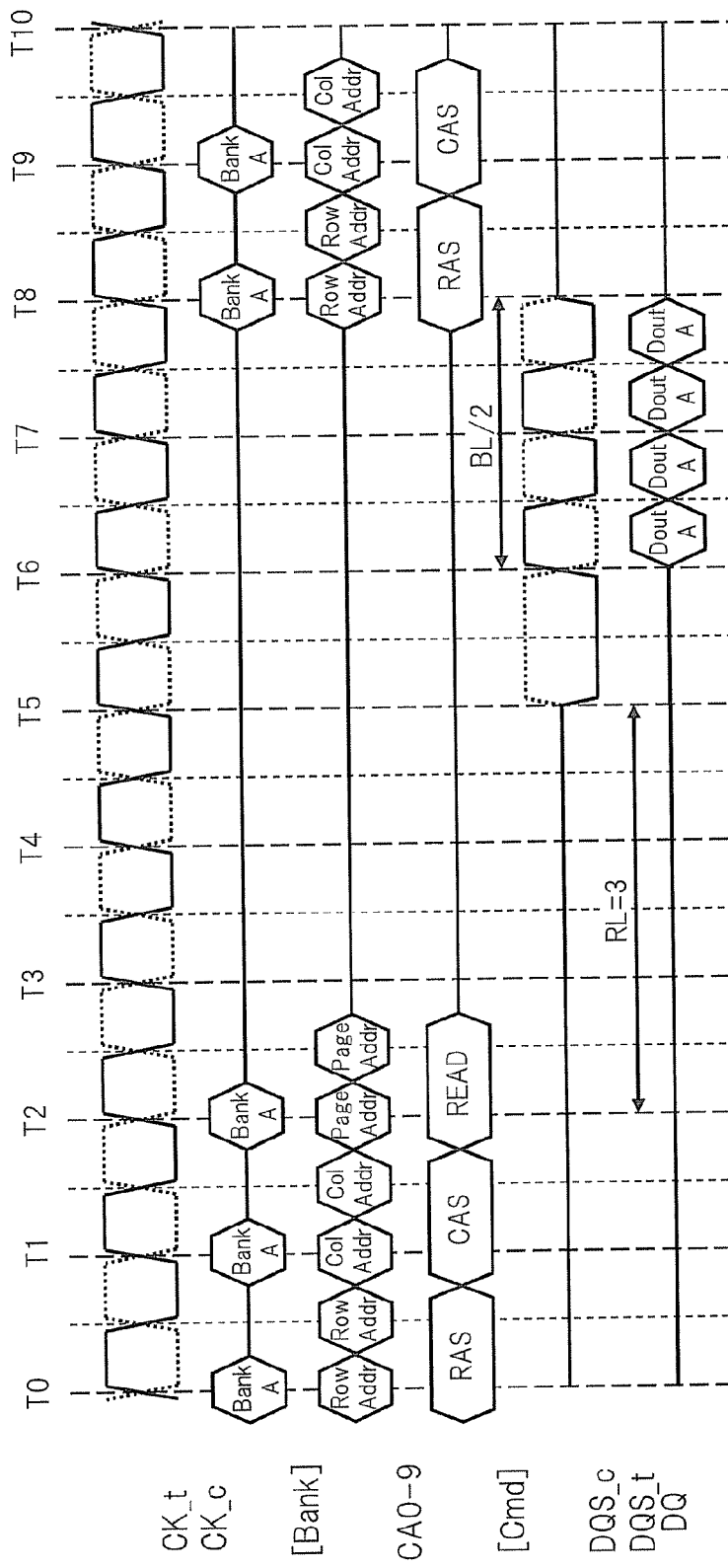
FIG. 10 is a timing chart showing an example of an operation timing of a semiconductor memory device 1 according to an embodiment.

FIG. 10 shows an example in which a RAS command, a CAS command, and a READ command are issued in order and, after three cycles since the READ command has been issued, data strobe signals DQS_c and DQS_t become high and low, respectively (read latency RL=3), with burst length BL=4 that indicates a burst data length.

As understood from FIG. 10, while a RAS command is being issued, bits of a row address at the high-order bit side thereof and bits of the row address at the low-order bit side thereof are separately input in order. Likewise, while a CAS command is being issued, bits of a column address at the high-order bit side thereof and bits of the column address at the low-order bit side thereof are separately input in order. Likewise, while a READ command is being issued, bits of a page address at the high-order bit side thereof and bits of the page address at the low-order bit side thereof are separately input in order.

Figure 11:
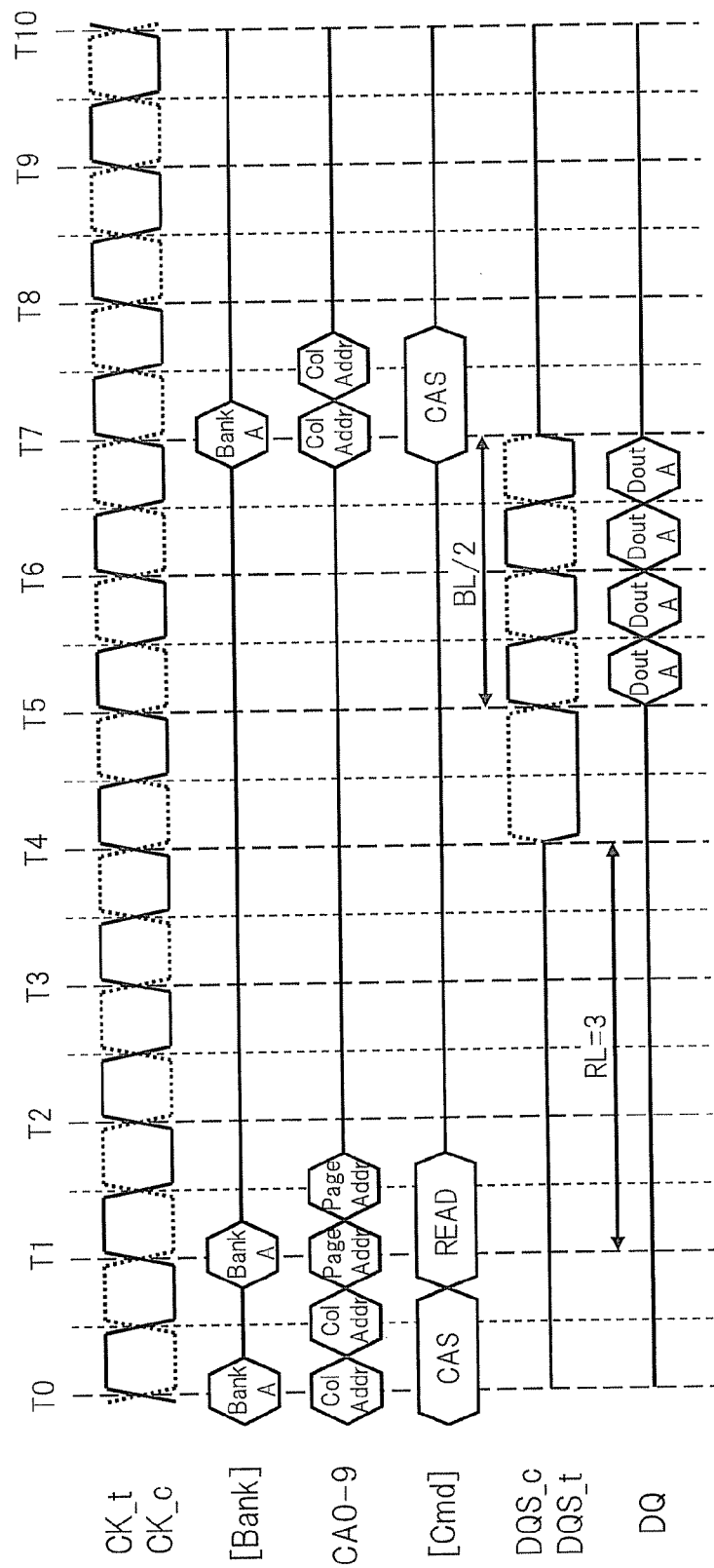
FIG. 11 is a timing chart showing another example of an operation timing of a semiconductor memory device 1 according to an embodiment.

FIG. 11 shows an example of omitting issuance of a RAS command. When issuance of a RAS command is omitted, a row address corresponding to the immediately preceding RAS command is applied as it is. In the case of FIG. 11, although a CAS command and a READ command are issued in order, the operation timing after the READ command is issued is the same as FIG. 10.

Figure 12:
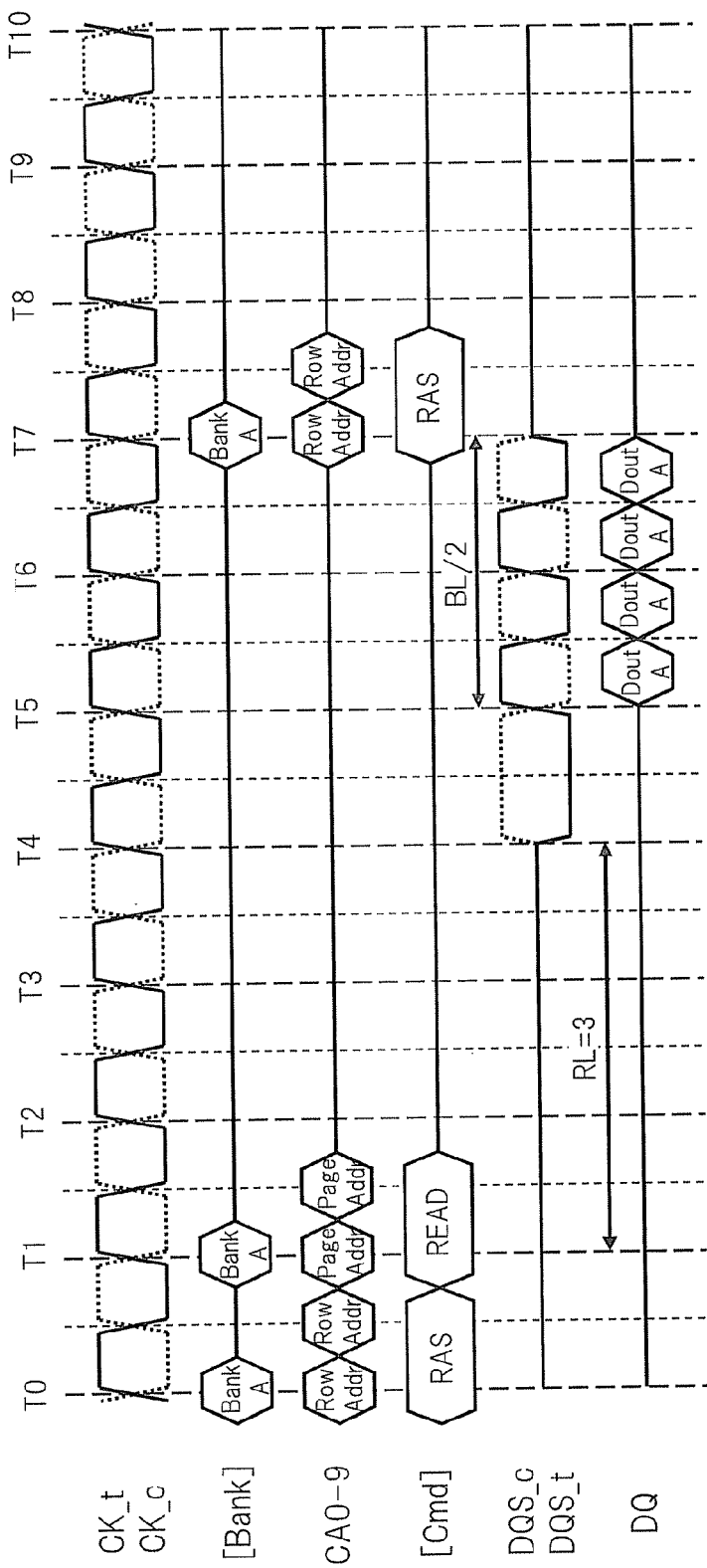
FIG. 12 is a timing chart showing another example of an operation timing of a semiconductor memory device 1 according to an embodiment.

FIG. 12 shows an example of omitting issuance of a CAS command. When issuance of a CAS command is omitted, a column address corresponding to an immediately preceding CAS command is applied as it is. In the case of FIG. 12, although a RAS command and a READ command are issued in order, the operation timing after the READ command is issued is the same as FIG. 10.

Figure 13:
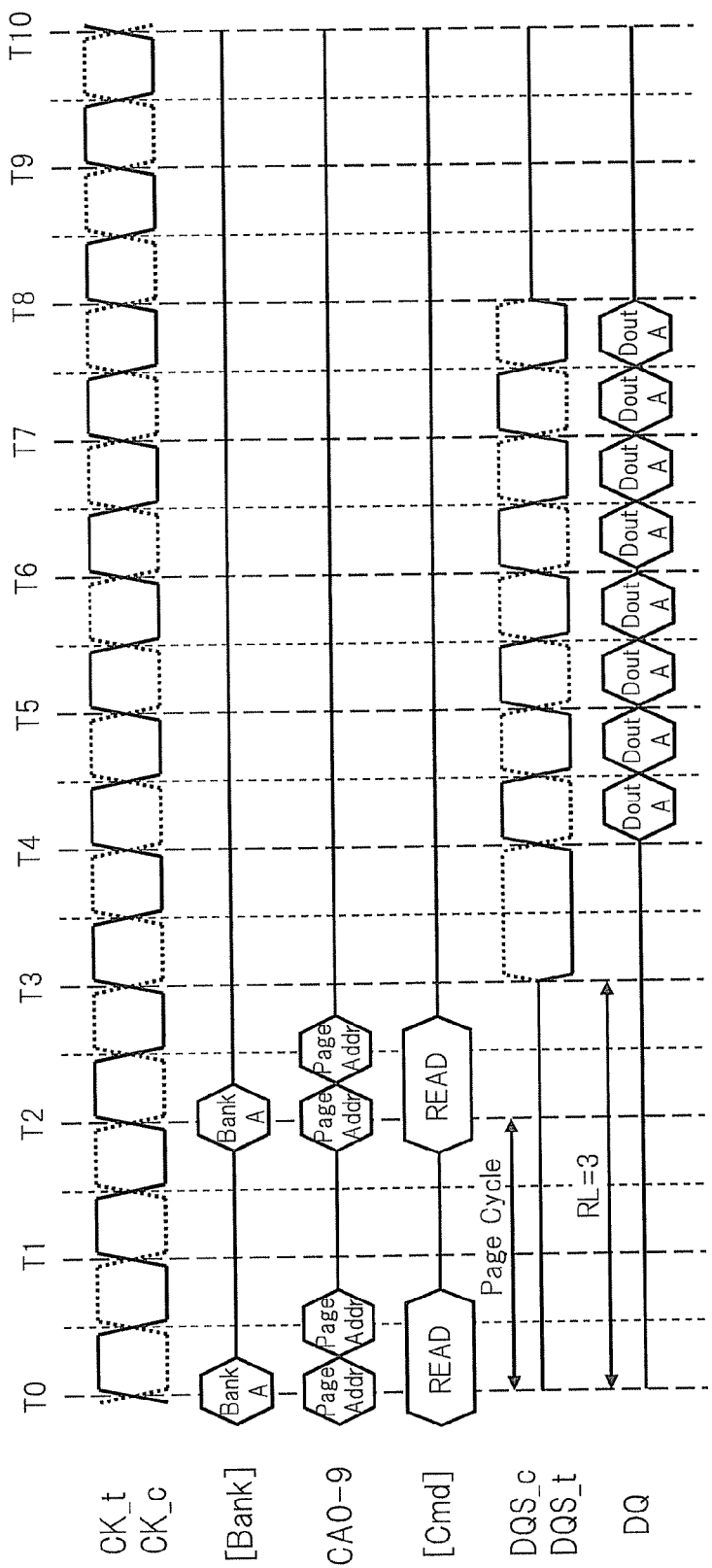
FIG. 13 is a timing chart showing another example of an operation timing of a semiconductor memory device 1 according to an embodiment.

FIG. 13 shows an example of omitting issuance of RAS and CAS commands. When issuance of RAS and CAS commands is omitted, row and column addresses at previous issuance of RAS and CAS commands are applied as they are. In the case of FIG. 13, only the READ commands are issued, with the interval between a READ command and the next READ command being one cycle. Data DQ is read after four cycles since the READ command has been issued. Therefore, when two READ commands are issued in secession, burst data of eight pieces in total are read in secession.

Figure 14:
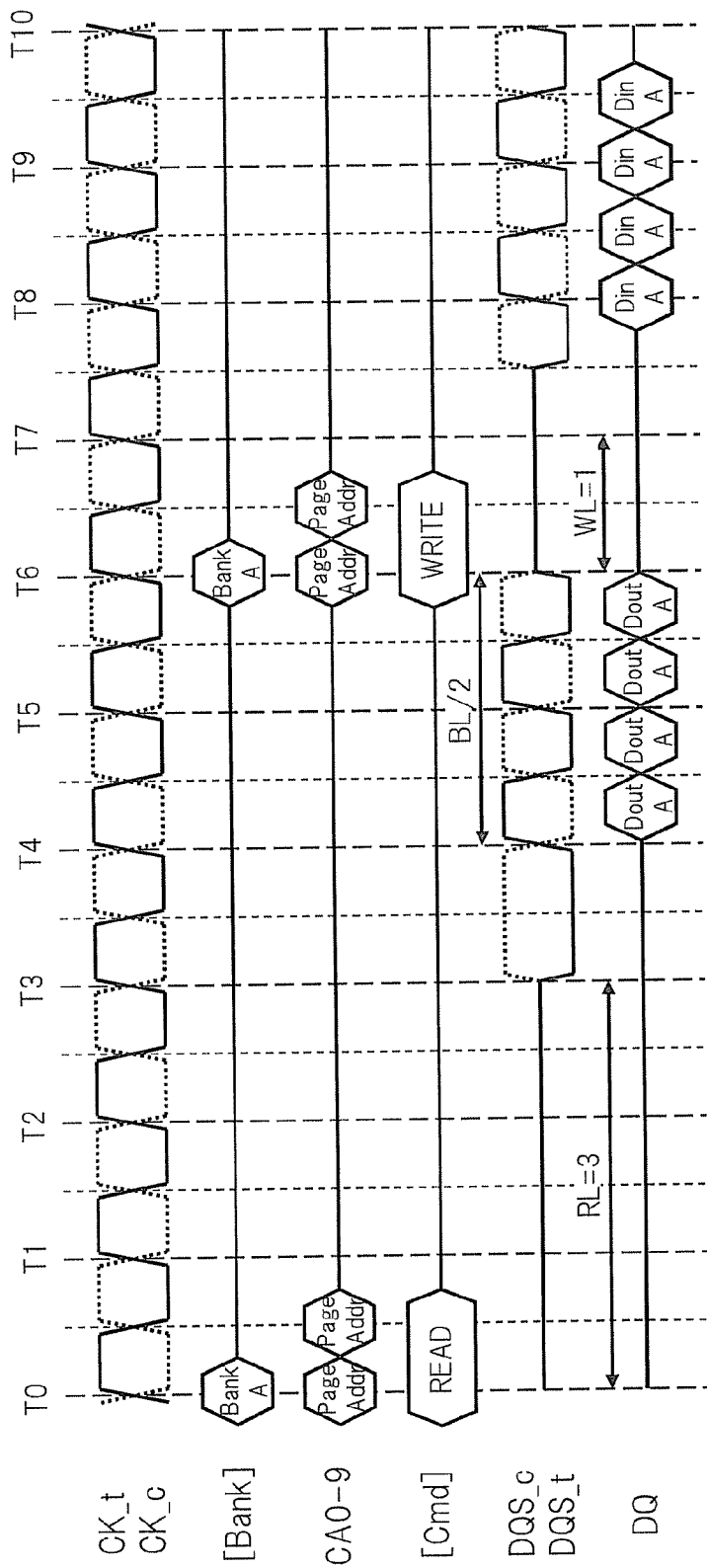
FIG. 14 is a timing chart showing another example of an operation timing of a semiconductor memory device 1 according to an embodiment.

FIG. 14 shows an example of omitting issuance of RAS and CAS commands, and issuing a WRITE command after a READ command is issued. Four pieces of burst data are read after four cycles since the READ command has been issued. Thereafter, the WRITE command is issued around time T6 and four pieces of burst data for writing are input at write latency WL=1.

Figure 15:
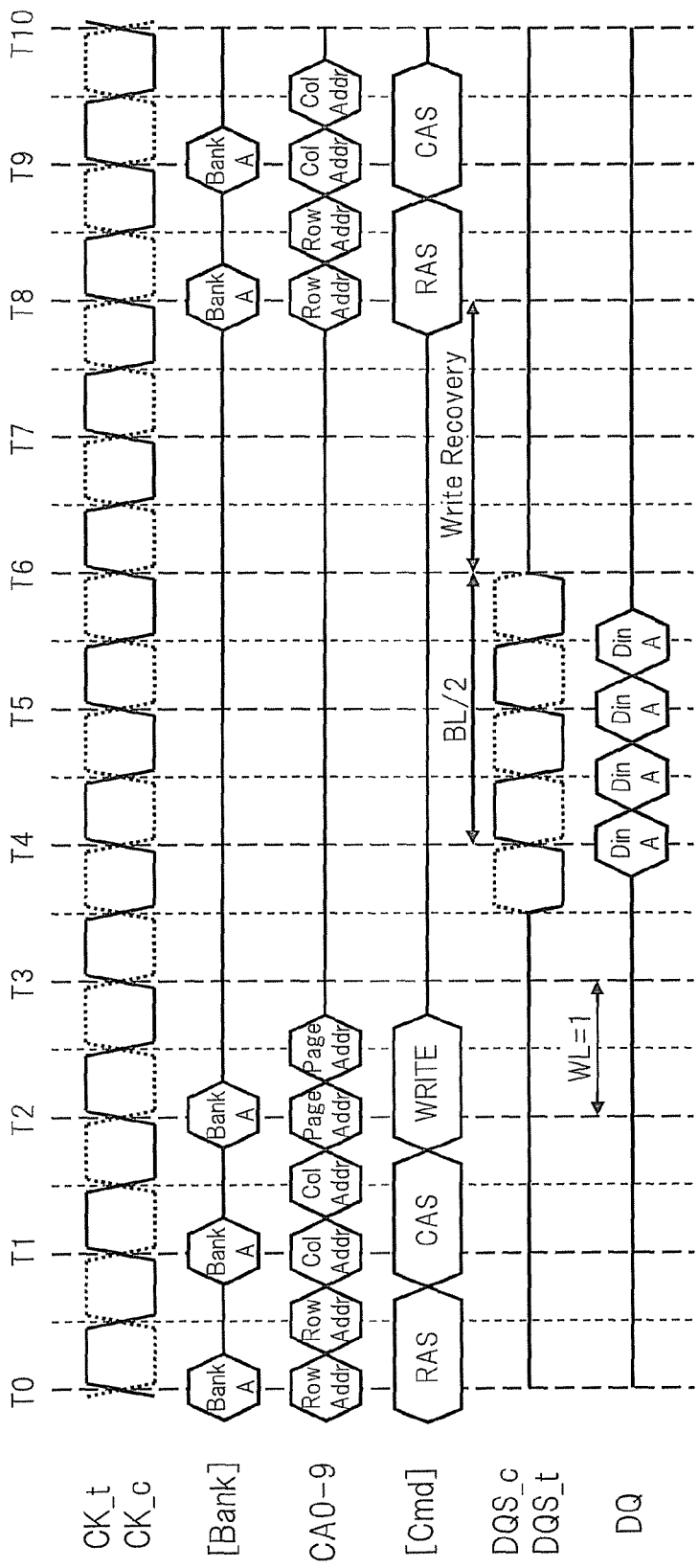
FIG. 15 is a timing chart showing another example of an operation timing of a semiconductor memory device 1 according to an embodiment.

FIGS. 15 to 19 are timing charts of examples of burst writing to the same bank. In FIG. 15, a RAS command, a CAS command, and a WRITE command are issued in order, thereafter, four pieces of burst data are input at a timing of being latched at a rising or falling edge of strobe signals DQS_c and DQS_t.

Figure 16:
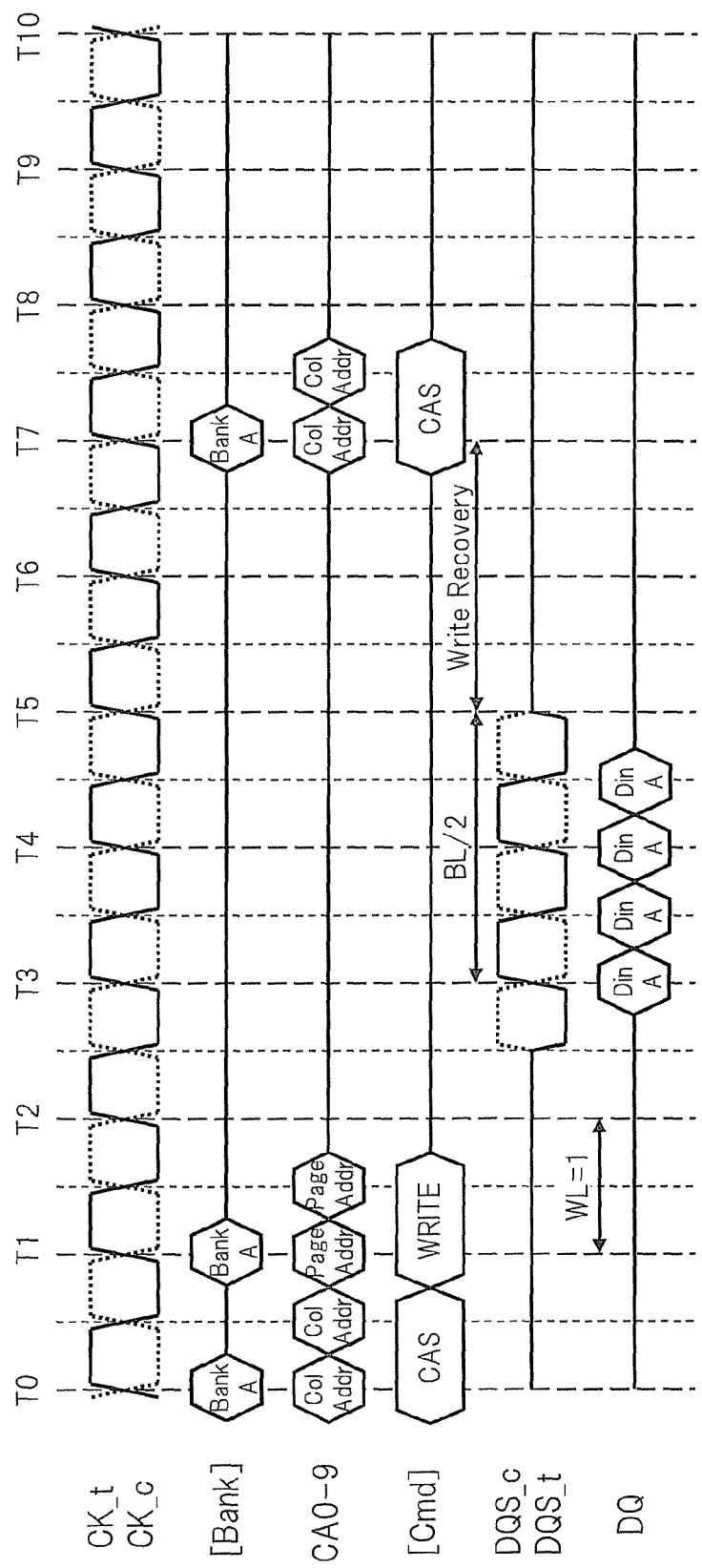
FIG. 16 is a timing chart showing another example of an operation timing of a semiconductor memory device 1 according to an embodiment.

FIG. 16 shows an example of omitting issuance of a RAS command and issuing a CAS command and a WRITE command in order. When issuance of a RAS command is omitted, a row address at previous issuance of a RAS command is applied as it is.

Figure 17:
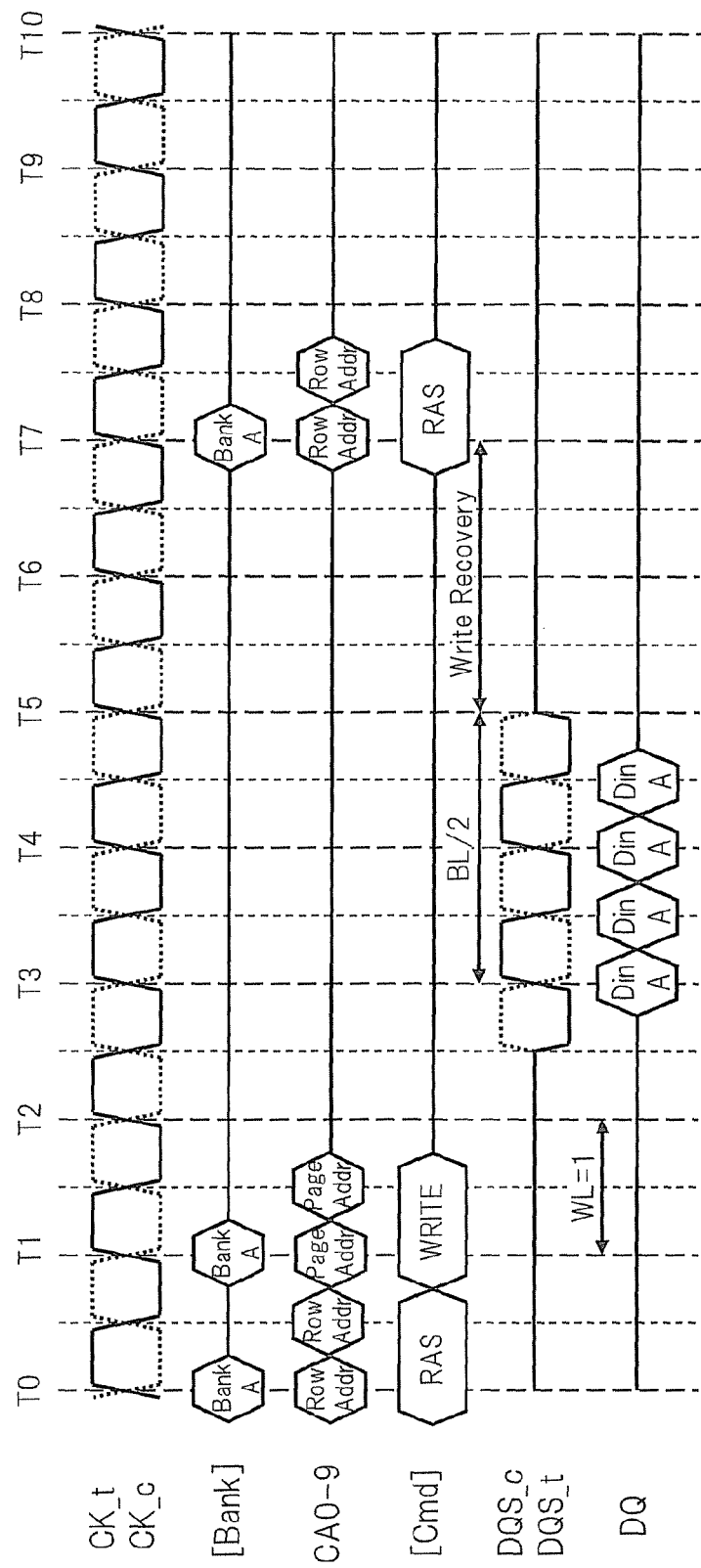
FIG. 17 is a timing chart showing another example of an operation timing of a semiconductor memory device 1 according to an embodiment.

FIG. 17 shows an example of omitting issuance of a CAS command and issuing a RAS command and a WRITE command in order. When issuance of a CAS command is omitted, a column address at previous issuance of a CAS command is applied as it is.

Figure 18:
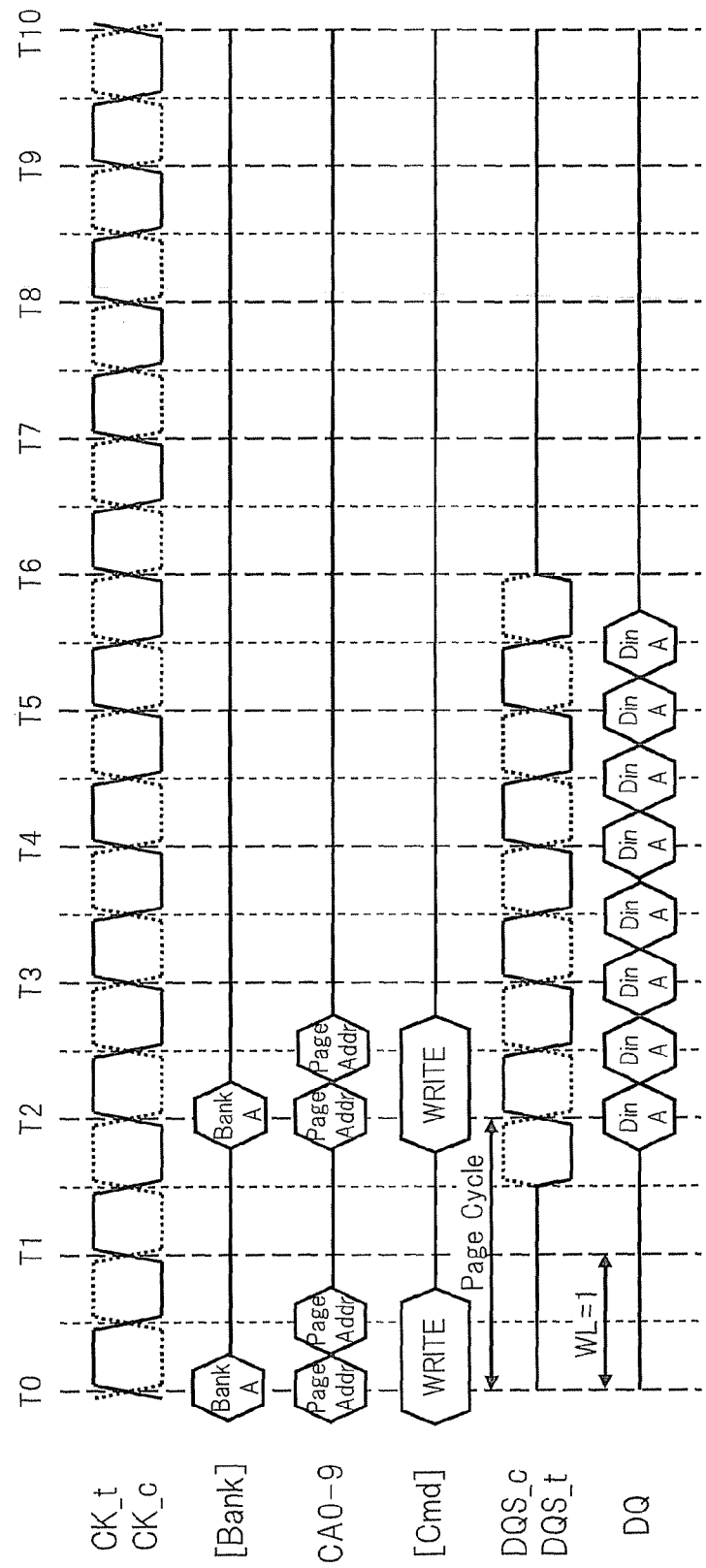
FIG. 18 is a timing chart showing another example of an operation timing of a semiconductor memory device 1 according to an embodiment.

FIG. 18 shows an example of omitting issuance of both of RAS and CAS commands. When issuance of RAS and CAS commands is omitted, row and column addresses at previous issuance of RAS and CAS commands are applied as they are. In the case of FIG. 18, WRITE commands are only issued, with the interval between a WRITE command and the next WRITE command being one cycle. Four pieces of burst data each being to be written by a WRITE command are input in succession.

Figure 19:
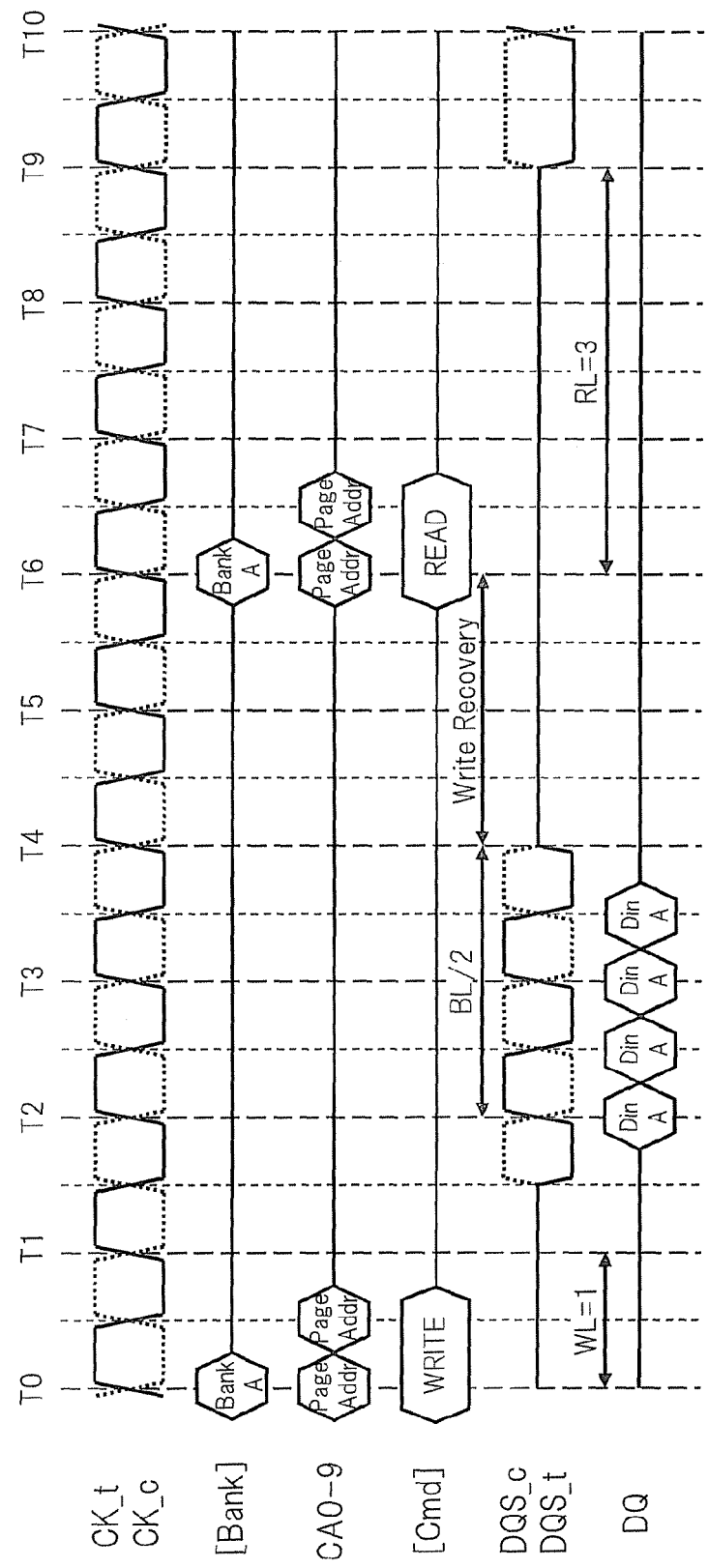
FIG. 19 is a timing chart showing another example of an operation timing of a semiconductor memory device 1 according to an embodiment.

FIG. 19 shows an example of omitting issuance of RAS and CAS commands and issuing a READ command after a WRITE command. In this case, four pieces of burst data for writing are input after a WRITE command is issued, thereafter, a READ command is issued after a specific recovery period, and thereafter, data strobe signals DQS_c and DQS_t vary after three cycles.

Figure 20:
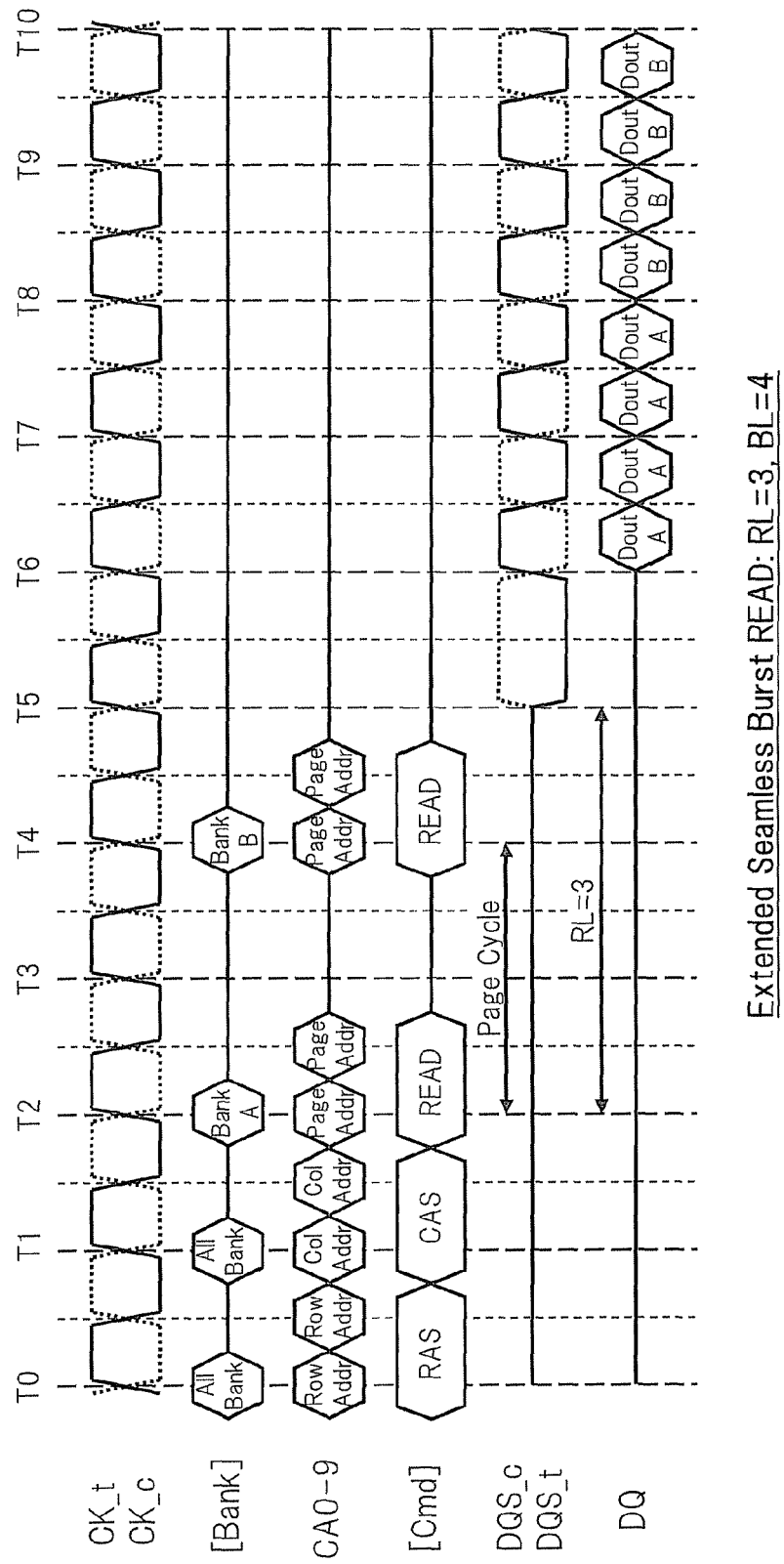
FIG. 20 is a timing chart showing another example of an operation timing of a semiconductor memory device 1 according to an embodiment.
Figure 21:
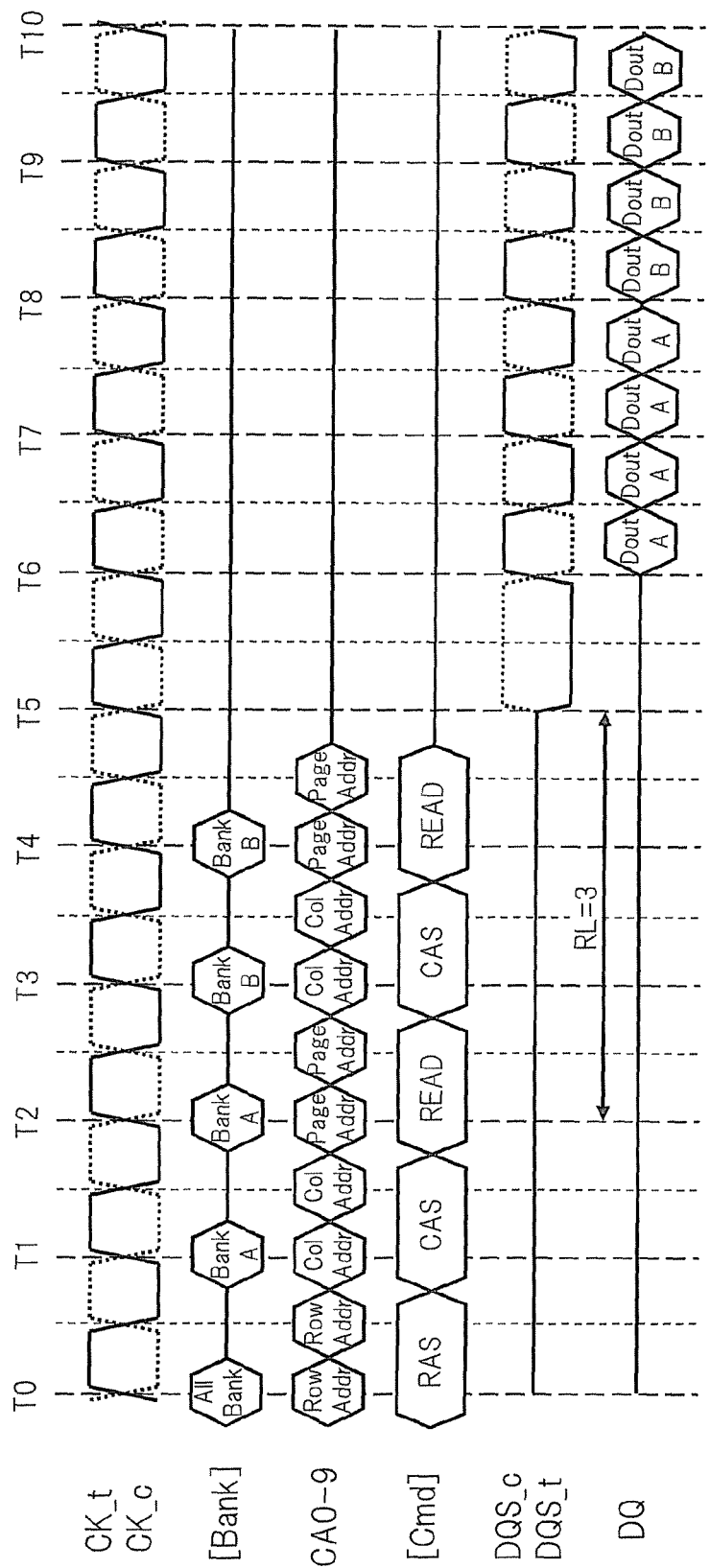
FIG. 21 is a timing chart showing another example of an operation timing of a semiconductor memory device 1 according to an embodiment.
Figure 22:
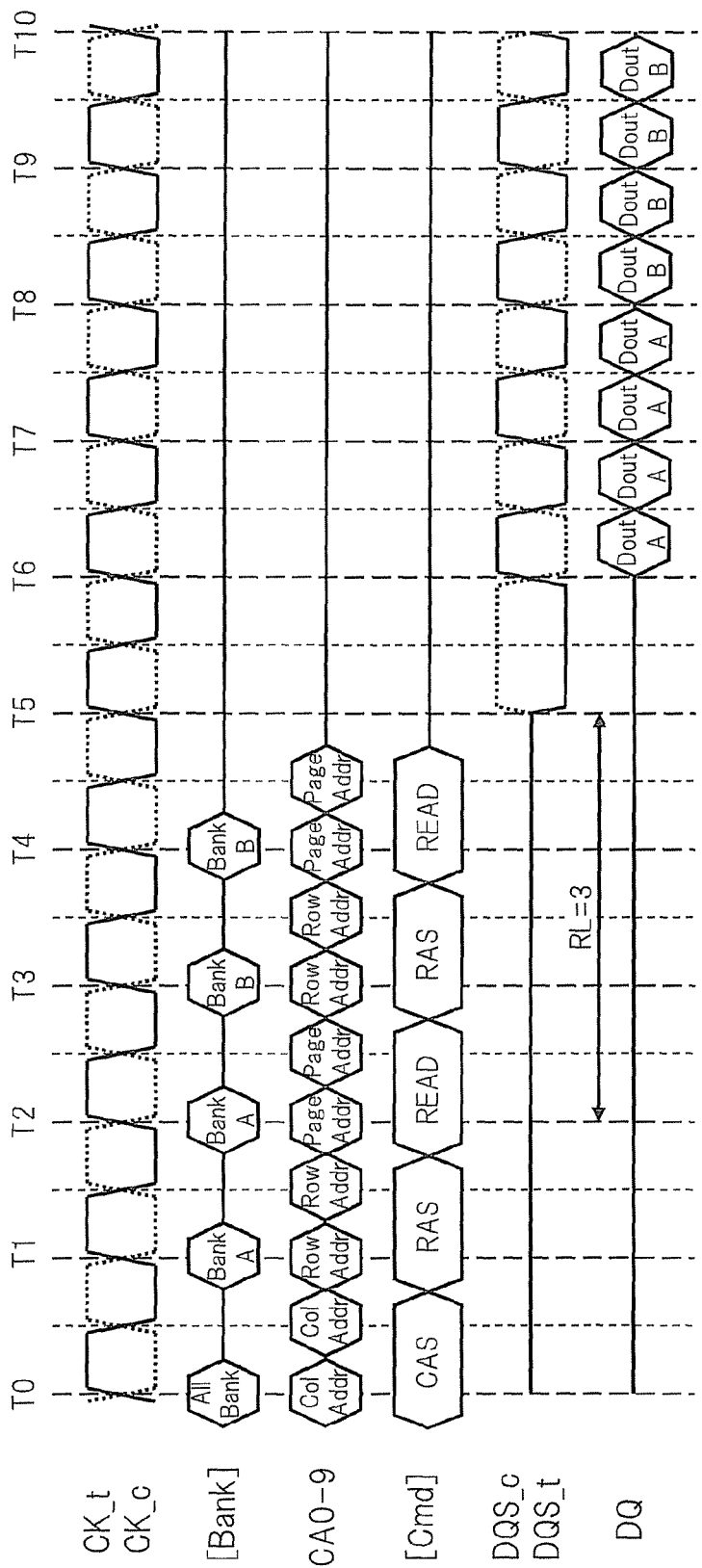
FIG. 22 is a timing chart showing another example of an operation timing of a semiconductor memory device 1 according to an embodiment.

FIGS. 20 to 22 are timing charts of examples of a burst reading operation to a plurality of banks. FIG. 20 shows an example in which RAS and CAS commands are issued in order for all banks, thereafter, a READ command is issued to a bank A, and next, a READ command is issued to a bank B. Burst data read in response to these two READ commands are output in succession after time T6.

FIG. 21 shows an example in which, after a RAS command is issued to all banks, CAS and READ commands are issued to a bank A in order, and next, CAS and READ commands are issued to a bank B in order. The timing of reading burst data in this case is the same as FIG. 20.

Contrary to FIG. 21, FIG. 22 shows an example in which, after a CAS command is issued to all banks, RAS and READ commands are issued to a bank A in order, and next, RAS and READ commands are issued to a bank B in order. The timing of reading burst data in this case is the same as FIGS. 20 and 21.

Figure 23:
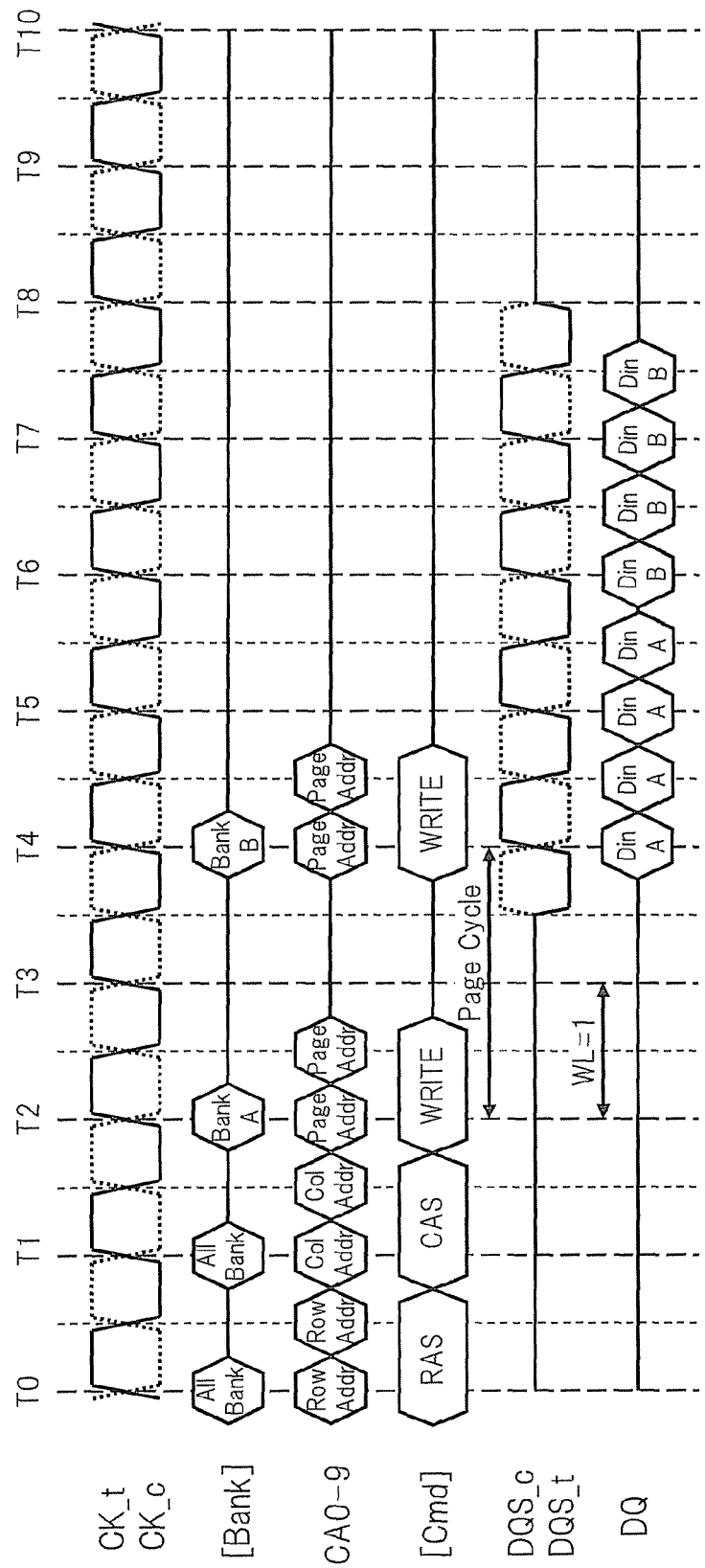
FIG. 23 is a timing chart showing another example of an operation timing of a semiconductor memory device 1 according to an embodiment.
Figure 24:
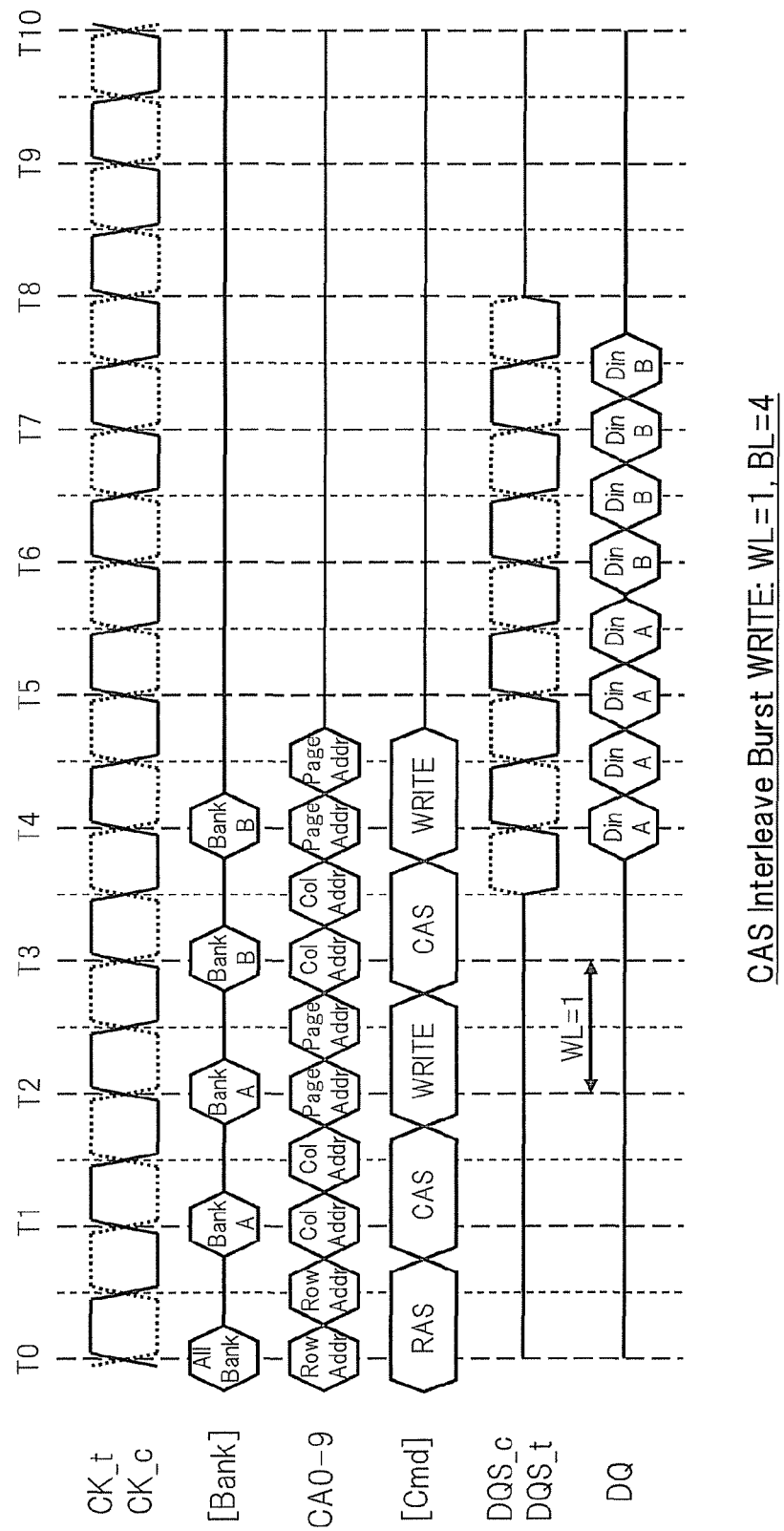
FIG. 24 is a timing chart showing another example of an operation timing of a semiconductor memory device 1 according to an embodiment.
Figure 25:
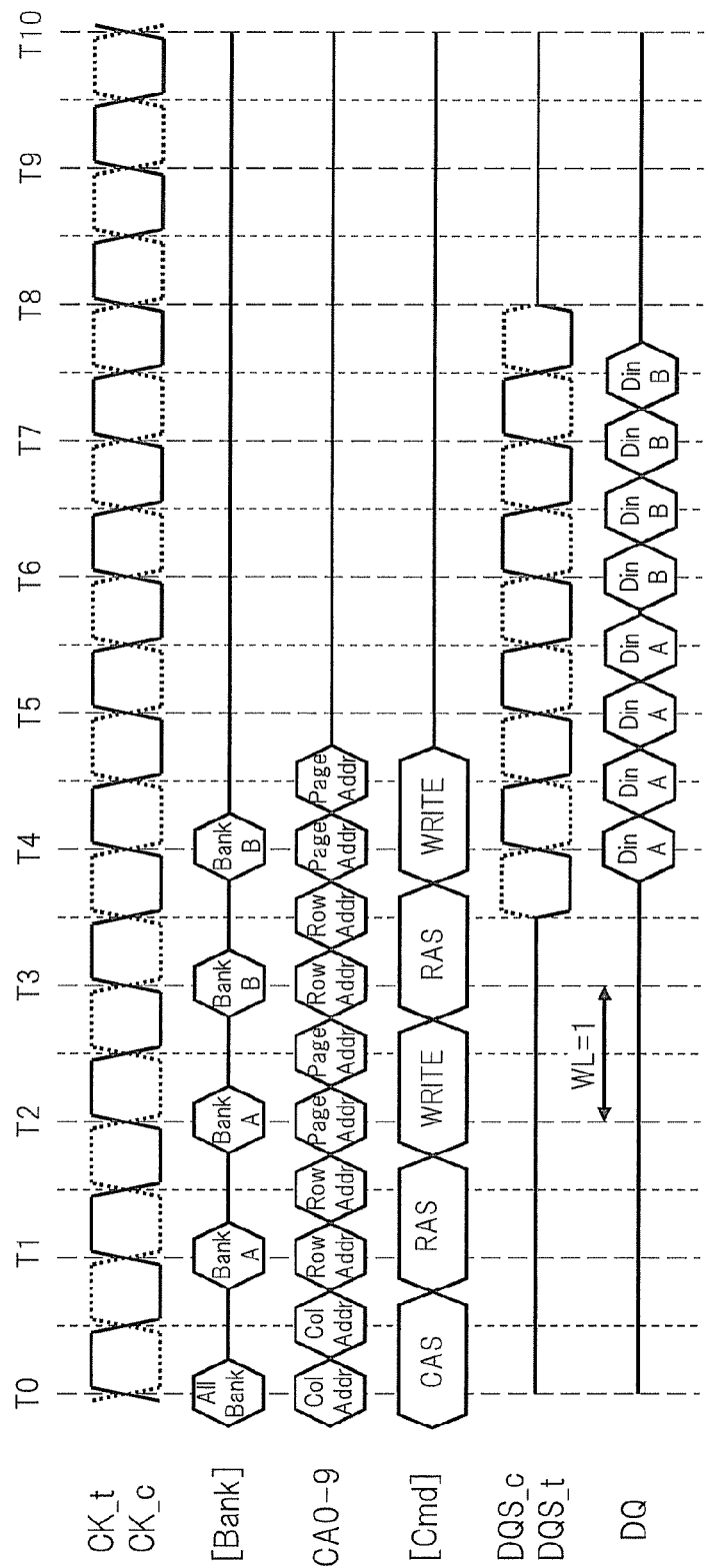
FIG. 25 is a timing chart showing another example of an operation timing of a semiconductor memory device 1 according to an embodiment.

FIGS. 23 to 25 are timing charts of examples of a burst writing operation to a plurality of banks. FIG. 23 shows an example in which RAS and CAS commands are issued in order for all banks, thereafter, a WRITE command is issued to a bank A, and next, a WRITE command is issued to a bank B. Burst data to be written in response to these two WRITE commands are input in succession after time T4.

FIG. 24 shows an example in which, after a RAS command is issued for all banks, CAS and WRITE commands are issued to a bank A in order, and next, CAS and WRITE commands are issued to a bank B in order. In this case, the timing at which burst data to be written are input is the same as FIG. 23.

Contrary to FIG. 24, FIG. 25 shows an example in which, after a CAS command is issued for all banks, RAS and WRITE commands are issued to a bank A in order, and next, RAS and WRITE commands are issued to a bank B in order. In this case, the timing at which burst data to be written are input is the same as FIGS. 23 and 24.

As described above, in this embodiment, when the semiconductor memory device 1 has a plurality of banks, at least either one of RAS and CAS commands may be issued for all banks or a RAS or CAS command may be issued for each bank. Therefore, as shown in FIGS. 10 to 25, for all or some banks, reading and writing to a plurality of memory cells can be performed per page after row and column selection for each block array 2.

Other Embodiments

For the memory cells in the semiconductor memory devices 1 in the first and second embodiments, there is no limitation on the actual types as far as the memory cells are non-volatile and non-destructively readable. Several types of non-volatile and non-destructively readable memories, such as, MRAM, PRAM (Phase Change RAM), SPRAM (Spin-Transfer Torque RAM), and ReRAM (Resistance RAM) are applicable.

Figure 26:
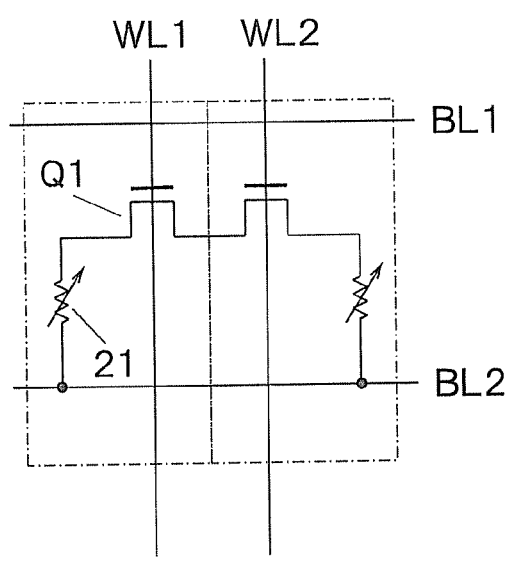
FIG. 26 is a circuit diagram in the case of using an MRAM cell as a memory cell in first and second embodiments.

FIG. 26 is a circuit diagram in the case of using an MRAM cell as the memory cells in the first and second embodiments. FIG. 26 shows two memory cells adjacent to each other. Each memory cell has one transistor Q1 and one MTJ element 21. A terminal of the MTJ element 21 is connected to a terminal of a current path of the transistor Q1. The other terminal of the current path of the transistor Q1 is connected to a first bit line and to a terminal of a transistor Q1 in the adjacent memory cell. The gate of the transistor Q1 is connected to a word line WL1. The other terminal of the MTJ element 21 is connected to a bit line BL2.

The MTJ element 21 has a structure in which an insulation film is inserted between a lower fixed layer and an upper fixed layer, both layers being a ferromagnetic film. In writing, a current is flown to the MTJ element 21 to change the magnetization direction of the upper fixed layer. The resistance value of the MTJ element 21 varies depending on the magnetization direction. In reading, the magnetization direction of the upper fixed layer is detected according to the resistance value of the MTJ element 21.

When the block array 2 is fabricated with MRAM cells such as shown in FIG. 26, high-speed writing and reading, and higher integration are possible. In order to perform writing or reading to an MRAM cell, it is required to make current flow to the MTJ element 21. Therefore, circuit noises may be generated if simultaneous access is made to a plurality of MRAM cells. In contrast, in the first and second embodiments described above, reading and writing are performed to a plurality of memory cells at different locations and timings, so that generation of circuit noises can be restricted.

The present invention is not limited to the embodiments described above but includes various modifications conceivable by those skilled in the art. The effects of the present invention are also not limited to those described above. Namely, various additions, modifications and partial omissions may be made without departing from the conceptual idea and gist of present invention derived from those defined in the accompanying claims and their equivalents.

The invention claimed is:

1. A semiconductor memory device comprising:
   a block array having an m number of memory blocks in a row direction and an n number of memory blocks in a column direction (m being an integer of 2 or more and n being an integer of 1 or more);
   a page selection circuit configured to select a row in the block array as a page to be selected; and
   a page buffer configured to store data to be written in a page selected by the page selection circuit or data read from the page,
   wherein each of the memory blocks comprising:
   a memory cell array having a plurality of memory cells;
   a row selection circuit configured to select a row of the memory cell array; and
   a column selection circuit configured to select a column of the memory cell array,
   wherein when a row-specifying command and a row address are given, a group of memory cells of a specific row corresponding to the given row address is selected for each of the n number of memory blocks aligned in the column direction in the block array,
   when a column-specifying command and a column address are given, a group of memory cells of a specific column corresponding to the given column address is selected for each of the m number of memory blocks aligned in the row direction in the block array, and
   when the page selection circuit is given a per-page read or write command and the corresponding page address, the page selection circuit simultaneously selects a plurality of memory cells separated from one another in a page indicated by the given page address among a group of memory cells selected by a row-specifying command, a row address, a column-specifying command and a column address that are given just before the per-page read or write command and the corresponding page address.

2. The device of claim 1, wherein when the page selection circuit is given a per-page read command and a page address, the page selection circuit performs control to simultaneously select data from a plurality of memory cells separated from one another in a page indicated by the given page address and to store the data in the page buffer, and
   when the page selection circuit is given a per-page write command and a page address, the page selection circuit writes data stored in the page buffer in a plurality of memory cells separated from one another in a page indicated by the given page address.

3. The device of claim 1, wherein each of a plurality of memory cells separated from one another in a page that are simultaneously selected by the page selection circuit belong to different one among the memory blocks.

4. The device of claim 1 further comprising a peripheral control circuit configured to supply the row- and column-specifying commands and the read and write commands input from outside in a random input order to the block array or the page selection circuit in the input order.

5. The device of claim 1 further comprising a plurality of banks each having the block array, the page selection circuit, and the page buffer,
   wherein the row- and column-specifying commands are issued to all of the banks or some of the banks, and
   the read and write commands are issued to a specific bank.

6. The device of claim 1, wherein when issuance of at least either the row-specifying command or the column-specifying command is omitted, selection of a group of memory cells is performed based on an immediately preceding issued command.

7. The device of claim 1, wherein each memory cell is an MRAM cell.

8. A memory system comprising:
a semiconductor memory device; and
a controller configured to control the semiconductor memory device,
wherein the semiconductor memory device comprises:
a block array having an m number of memory blocks in a row direction and an n number of memory blocks in a column direction (m being an integer of 2 or more and n being an integer of 1 or more);
a page selection circuit configured to select a row in the block array as a page to be selected; and
a page buffer configured to store data to be written in a page selected by the page selection circuit or data read from the page,
wherein each of the memory blocks comprises:
a memory cell array having a plurality of memory cells;
a row selection circuit configured to select a row of the memory cell array; and
a column selection circuit configured to select a column of the memory cell array,
wherein when a row-specifying command and a row address are given, a group of memory cells of a specific row corresponding to the given row address is selected for each of the n number of memory blocks aligned in the column direction in the block array,
when a column-specifying command and a column address are given, a group of memory cells of a specific column corresponding to the given column address is selected for each of the m number of memory blocks aligned in the row direction in the block array, and
when the page selection circuit is given a per-page read or write command and the corresponding page address, the page selection circuit simultaneously selects a plurality of memory cells separated from one another in a page indicated by the given page address among a group of memory cells selected by a row-specifying command, a row address, a column-specifying command and a column address that are given just before the per-page read or write command and the corresponding page address.

9. The system of claim 8, wherein when the page selection circuit is given a per-page read command and a page address, the page selection circuit performs control to simultaneously read data from a plurality of memory cells separated from one another in a page indicated by the given page address and to store the data in the page buffer, and
when the page selection circuit is given a per-page write command and a page address, the page selection circuit performs control to write data stored in the page buffer in a plurality of memory cells separated from one another in a page indicated by the given page address.

10. The system of claim 8, wherein each of a plurality of memory cells separated from one another in a page that are simultaneously selected by the page selection circuit belong to different one among the memory blocks.

11. The system of claim 8 further comprising a peripheral control circuit configured to supply the row- and column-specifying commands and the read and write commands input from outside in a random input order to the block array or the page selection circuit in the input order.

12. The system of claim 8 further comprising a plurality of banks each having the block array, the page selection circuit, and the page buffer,
wherein the row- and column-specifying commands are issued to all of the banks or some of the banks, and
the read and write commands are issued to a specific bank.

13. The system of claim 8, wherein when issuance of at least either the row-specifying command or the column-specifying command is omitted, selection of a group of memory cells is performed based on an immediately preceding issued command.

14. The system of claim 8, wherein each memory cell is an MRAM cell.

15. An access method to a semiconductor memory device that comprises:
a block array having an m number of memory blocks in a row direction and an n number of memory blocks in a column direction (m being an integer of 2 or more and n being an integer of 1 or more);
a page selection circuit configured to select a row in the block array as a page to be selected; and
a page buffer configured to store data to be written in a page selected by the page selection circuit or data read from the page,
wherein each of the memory blocks comprises:
a memory cell array having a plurality of memory cells;
a row selection circuit configured to select a row of the memory cell array; and
a column selection circuit configured to select a column of the memory cell array,
wherein the method comprises:
when a row-specifying command and a row address are given, selecting a group of memory cells of a specific row corresponding to the given row address for each of the n number of memory blocks aligned in the column direction in the block array,
when a column-specifying command and a column address are given, selecting a group of memory cells of a specific column corresponding to the given column address for each of the m number of memory blocks aligned in the row direction in the block array, and
when the page selection circuit is given a per-page read or write command and the corresponding page address, the page selection circuit simultaneously selects a plurality of memory cells separated from one another in a page indicated by the given page address among a group of memory cells selected by a row-specifying command, a row address, a column-specifying command and a column address that are given just before the per-page read or write command and the corresponding page address.

16. The method of claim 15, wherein when the page selection circuit is given a per-page read command and a page address, the page selection circuit performs control to simultaneously read data from a plurality of memory cells separated from one another in a page indicated by the given page address and to store the data in the page buffer, and
when the page selection circuit is given a per-page write command and a page address, the page selection circuit performs control to write data stored in the page buffer in a plurality of memory cells separated from one another in a page indicated by the given page address.

17. The method of claim 15, wherein each of a plurality of memory cells separated from one another in a page that are simultaneously selected by the page selection circuit belong to different one among the memory blocks.

18. The method of claim 15 further comprising supplying the row- and column-specifying commands and the read and write commands input from outside in a random input order to the block array or the page selection circuit in the input order.

19. The method of claim 15, the semiconductor memory device comprises a plurality of banks each having the block array, the page selection circuit, and the page buffer, wherein the row- and column-specifying commands are issued to all of the banks or some of the banks, and the read and write commands are issued to a specific bank.

20. The method of claim 15, wherein each memory cell is an MRAM cell.

* * * * *